US012777935B2

(12) United States Patent
Kim et al.

(10) Patent No.: US 12,777,935 B2
(45) Date of Patent: Oct. 27, 2026

(54) SEMICONDUCTOR DEVICE AND METHOD OF MANUFACTURING THE SEMICONDUCTOR DEVICE

(71) Applicant: SAMSUNG ELECTRONICS CO., LTD., Suwon-si (KR)

(72) Inventors: Myoungsoo Kim, Suwon-si (KR); Jisung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 746 days.

(21) Appl. No.: 18/110,233

(22) Filed: Feb. 15, 2023

(65) Prior Publication Data

US 2023/0299016 A1 Sep. 21, 2023

(30) Foreign Application Priority Data

Mar. 21, 2022 (KR) ........................ 10-2022-0034481

(51) Int. Cl.

*H10W 42/00* (2026.01)
*H10W 20/42* (2026.01)
*H10W 20/20* (2026.01)
*H10W 20/40* (2026.01)
*H10W 72/20* (2026.01)

(Continued)

(52) U.S. Cl.

CPC ......... *H10W 42/121* (2026.01); *H10W 20/42* (2026.01); *H10W 42/00* (2026.01); *H10W 72/252* (2026.01); *H10W 72/29* (2026.01); *H10W 72/90* (2026.01)

(58) Field of Classification Search

CPC . H01L 23/562; H01L 23/5226; H01L 23/564; H01L 24/05; H01L 24/13; H01L 2224/0401; H01L 2224/13111; H01L 2224/13116; H01L 2224/13147; H01L 2224/13171; H01L 2224/13184; H01L 2224/13021; H01L 23/585; H01L 21/76816; H01L 21/76877; H01L 23/481; H01L 23/485; H01L 42/121; H01L 20/42; H01L 42/00; H01L 72/252; H01L 72/29;

(Continued)

(56) References Cited

U.S. PATENT DOCUMENTS 7,138,700 B2 11/2006 Tomita et al.
7,453,128 B2 11/2008 Tsutsue et al.

(Continued)

*Primary Examiner* — Zandra V Smith
*Assistant Examiner* — Daniel J Hibbert
(74) *Attorney, Agent, or Firm* — Sughrue Mion, PLLC

(57) ABSTRACT

A semiconductor device includes a substrate including a circuit region and a protection region surrounding the circuit region, a plurality of insulating layers sequentially provided on the substrate, a moisture blocking structure extending in the plurality of insulating layers in the protection region of the substrate and surrounding the circuit region, the moisture blocking structure including a first plurality of wiring layers vertically provided on a surface of the substrate, where an uppermost wiring layer of the first plurality of wiring layers comprises a first via, and a metal wiring provided on the first via, and a crack stopper extending in the plurality of insulating layers in the protection region of the substrate and surrounding the moisture blocking structure, the crack stopper including a second plurality of wiring layers vertically provided on the surface of the substrate.

20 Claims, 19 Drawing Sheets

(51) Int. Cl.
*H10W 72/29* (2026.01)
*H10W 72/90* (2026.01)

(58) Field of Classification Search
CPC ..... H01L 72/90; H01L 72/242; H01L 20/056; H01L 20/089; H01L 20/20; H01L 20/40
See application file for complete search history.

(56) References Cited

U.S. PATENT DOCUMENTS

| | | | | |
|---|---|---|---|---|
| 7,741,715 | B2 | 6/2010 | Kim et al. | |
| 8,022,509 | B2 | 9/2011 | Jao | |
| 8,513,808 | B2 * | 8/2013 | Hotta | H10W 42/00 257/E21.585 |
| 8,970,008 | B2 | 3/2015 | Gratz et al. | |
| 9,935,056 | B2 | 4/2018 | Kim et al. | |
| 10,622,312 | B2 | 4/2020 | Kim et al. | |
| 2005/0266661 | A1 | 12/2005 | Li et al. | |
| 2009/0096104 | A1 * | 4/2009 | Lee | H10W 42/00 257/E23.161 |
| 2010/0200958 | A1 * | 8/2010 | Angyal | H10W 42/00 438/424 |
| 2021/0050307 | A1 * | 2/2021 | Tsai | H10W 15/00 |
| 2021/0098392 | A1 | 4/2021 | Wu et al. | |

* cited by examiner

100

SEMICONDUCTOR DEVICE AND METHOD OF MANUFACTURING THE SEMICONDUCTOR DEVICE

CROSS-REFERENCE TO RELATED APPLICATION(S)

This application claims priority under 35 U.S.C. § 119 to Korean Patent Application No. 10-2022-0034481, filed on Mar. 21, 2022 in the Korean Intellectual Property Office, the disclosure of which is incorporated by reference herein in its entirety.

BACKGROUND

1. Field

Example embodiments of the present disclosure relate to a semiconductor device and a method of manufacturing the semiconductor device, and, more particularly, to a semiconductor device including protection structures capable of preventing crack propagation or penetration of moisture, and a method of manufacturing the semiconductor device.

2. Description of Related Art

Protective structures may be provided to prevent cracks from propagating from an edge of a semiconductor device to an active region during a wafer dicing process and to prevent penetration of moisture. In addition, a trench may be formed in an upper portion of an insulating layer on a scribe lane region and may extend to surround the protective structures, to prevent the cracks from propagating along an upper portion of the insulating layer. When the trench is formed to be relatively large, an upper portion of the protective structure including a metal such as aluminum is exposed by the trench, thereby causing defects in a subsequent bump forming process.

SUMMARY

Example embodiments provide a semiconductor device having structures that may be capable of more effectively preventing cracks from being generated during a wafer dicing process, and a method of manufacturing the semiconductor device.

Additional aspects will be set forth in part in the description which follows and, in part, will be apparent from the description, or may be learned by practice of the presented embodiments.

According to an aspect of an example embodiment, a semiconductor device includes a substrate including a circuit region and a protection region surrounding the circuit region, a plurality of insulating layers sequentially stacked on the substrate, a moisture blocking structure extending in the plurality of insulating layers in the protection region of the substrate and surrounding the circuit region, the moisture blocking structure including a first plurality of wiring layers vertically stacked on a surface of the substrate, where an uppermost wiring layer of the first plurality of wiring layers comprises a first via, and a metal wiring provided on the first via, and a crack stopper extending in the plurality of insulating layers in the protection region of the substrate and surrounding the moisture blocking structure, the crack stopper including a second plurality of wiring layers vertically stacked on the surface of the substrate, where an uppermost wiring layer of the second plurality of wiring layers comprises a second via, and a trench extending along an edge of the substrate and surrounding the crack stopper, the trench having a predetermined depth from an upper surface of the plurality of insulating layers.

According to an aspect of an example embodiment, a semiconductor device includes a substrate having a circuit region, a plurality of insulating layers sequentially stacked on the substrate, a first protection structure including a first plurality of wiring layers vertically stacked in the plurality of insulating layers on a surface of the substrate, the first protection structure extending along an edge of the substrate and surrounding the circuit region, a second protection structure including a second plurality of wiring layers vertically stacked in the plurality of insulating layers on the surface of the substrate, the second protection structure surrounding the first protection structure, and a trench surrounding the second protection structure, the trench having a predetermined depth from an upper surface of the plurality of insulating layers, where the first plurality of wiring layers of the first protection structure has a first height from the surface of the substrate, and the second plurality of wiring layers of the second protection structure has a second height from the surface of the substrate, the second height being less than the first height.

According to an aspect of an example embodiment, a semiconductor device includes a substrate including a circuit region, a plurality of insulating layers sequentially stacked on the substrate, a first protection structure including N wiring layers vertically stacked in the plurality of insulating layers on a surface of the substrate, the first protection structure extending along an edge of the substrate and surrounding the circuit region, a second protection structure including M wiring layers vertically stacked in the plurality of insulating layers on the surface of the substrate, the second protection structure surrounding the first protection structure, and a trench surrounding the second protection structure, the trench having a predetermined depth from an upper surface of the plurality of insulating layers, where N and M are natural numbers and M is less than or equal to N, an uppermost wiring layer of the N wiring layers of the first protection structure includes a first via and a metal wiring stacked on the first via, and an uppermost wiring layer of the M wiring layers of the second protection structure includes a second via.

BRIEF DESCRIPTION OF THE DRAWINGS

The above and other aspects, features, and advantages of certain example embodiments of the present disclosure will be more apparent from the following description taken in conjunction with the accompanying drawings, in which.

DETAILED DESCRIPTION

Hereinafter, example embodiments will be explained in detail with reference to the accompanying drawings.

Figure 1:
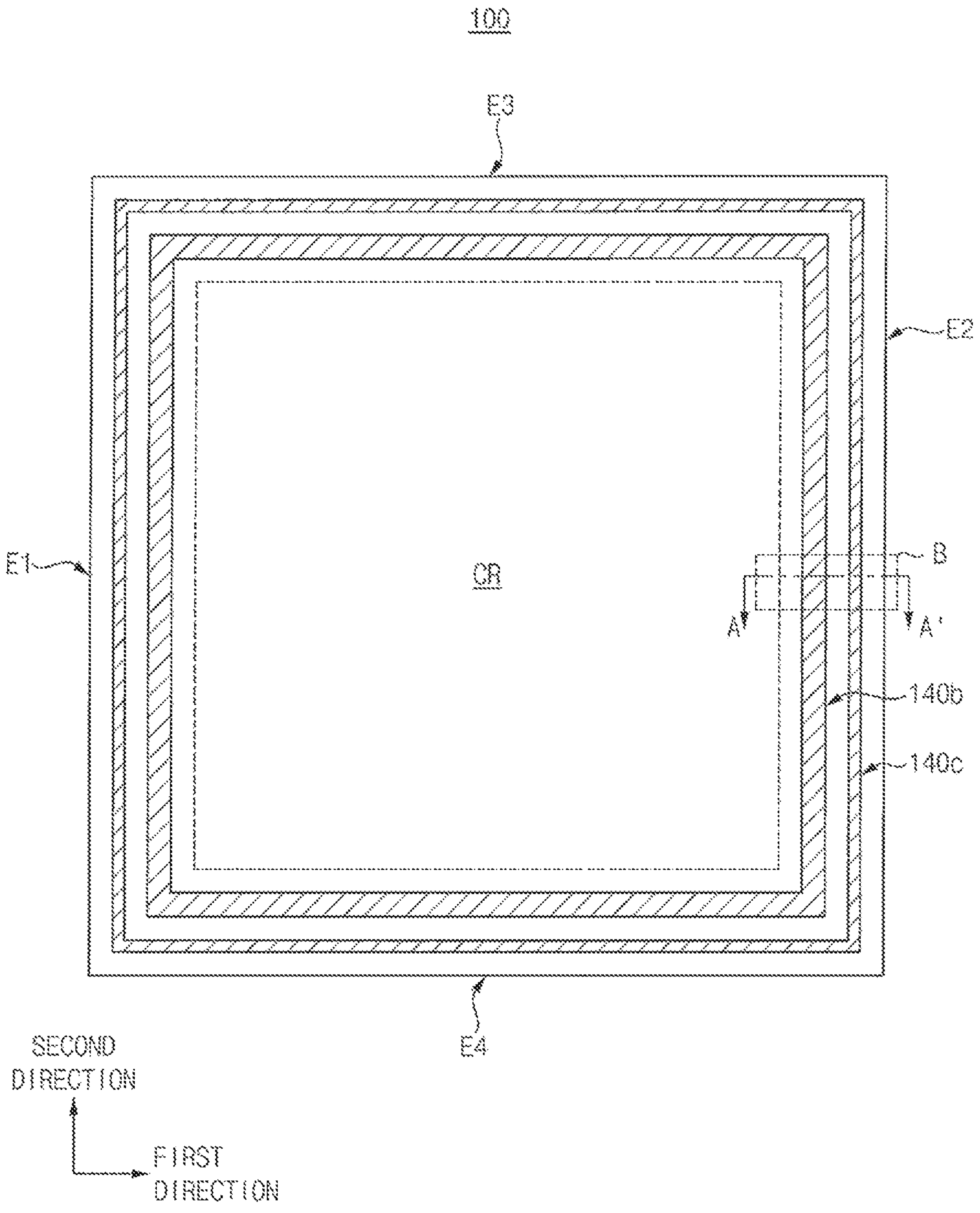
FIG. 1 is a plan view illustrating a semiconductor device according to an example embodiment.
Figure 2:
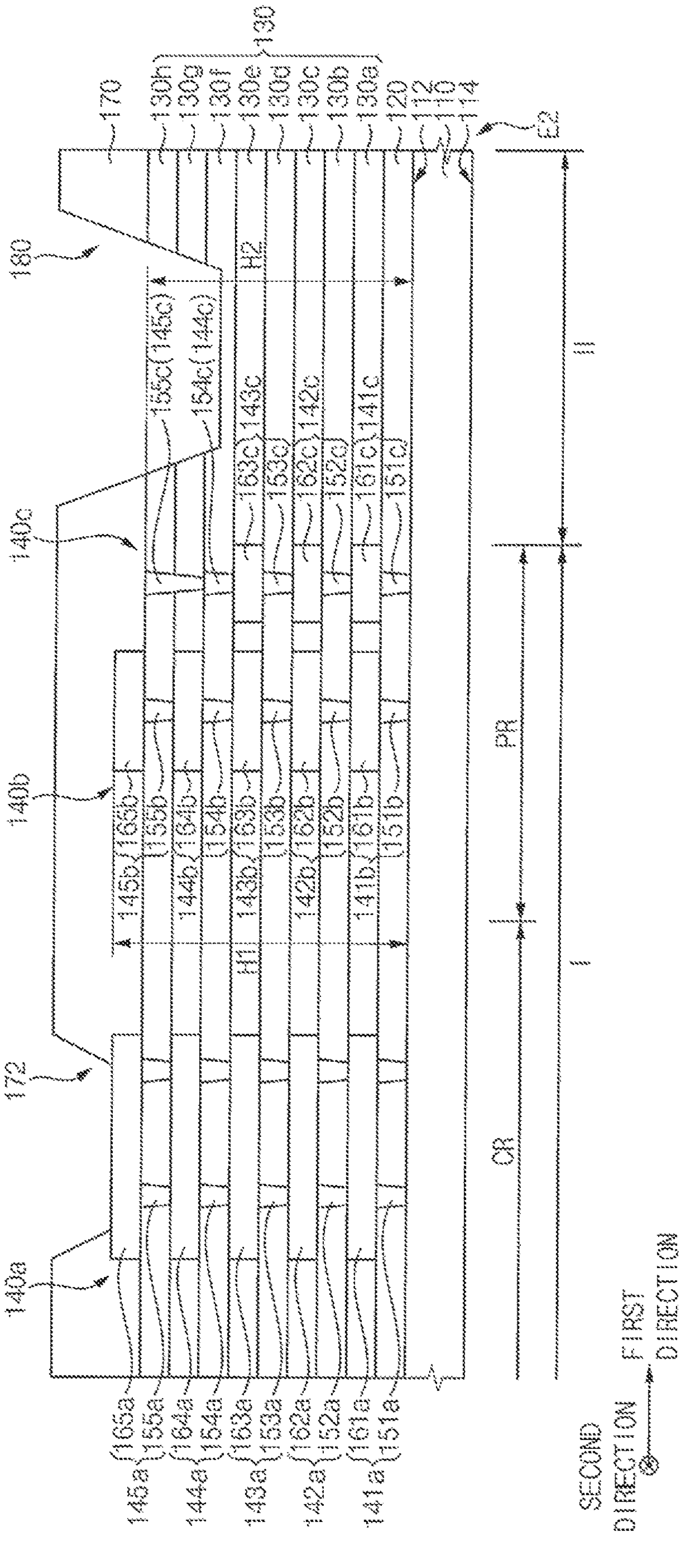
FIG. 2 is a cross-sectional view taken along the line A-A' in FIG. 1 according to an example embodiment.
Figure 3:
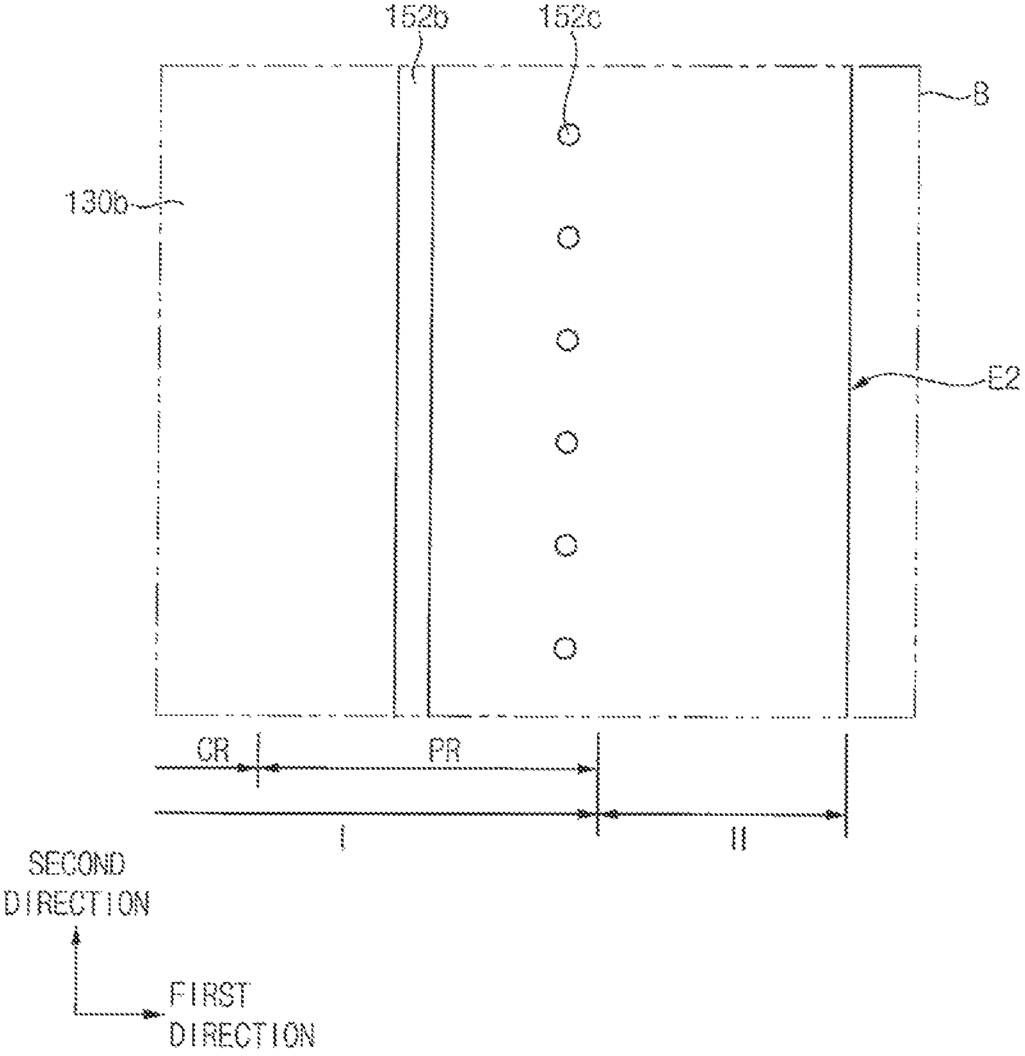
FIG. 3 is a plan view illustrating a portion of a second upper insulating layer of a metal wiring layer in FIG. 2 according to an example embodiment.
Figure 4:
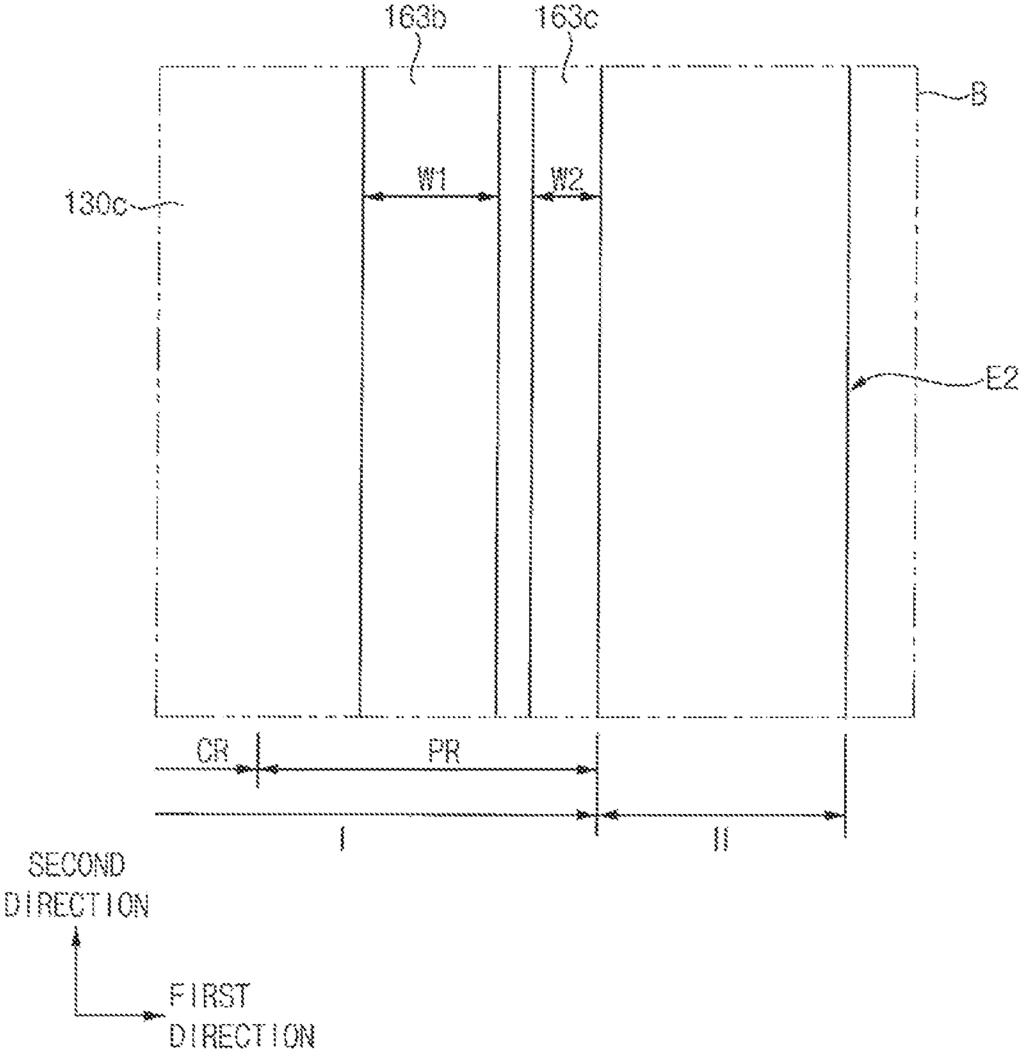
FIG. 4 is a plan view illustrating a portion of a third upper insulating layer of the metal wiring layer in FIG. 2 according to an example embodiment.
Figure 5:
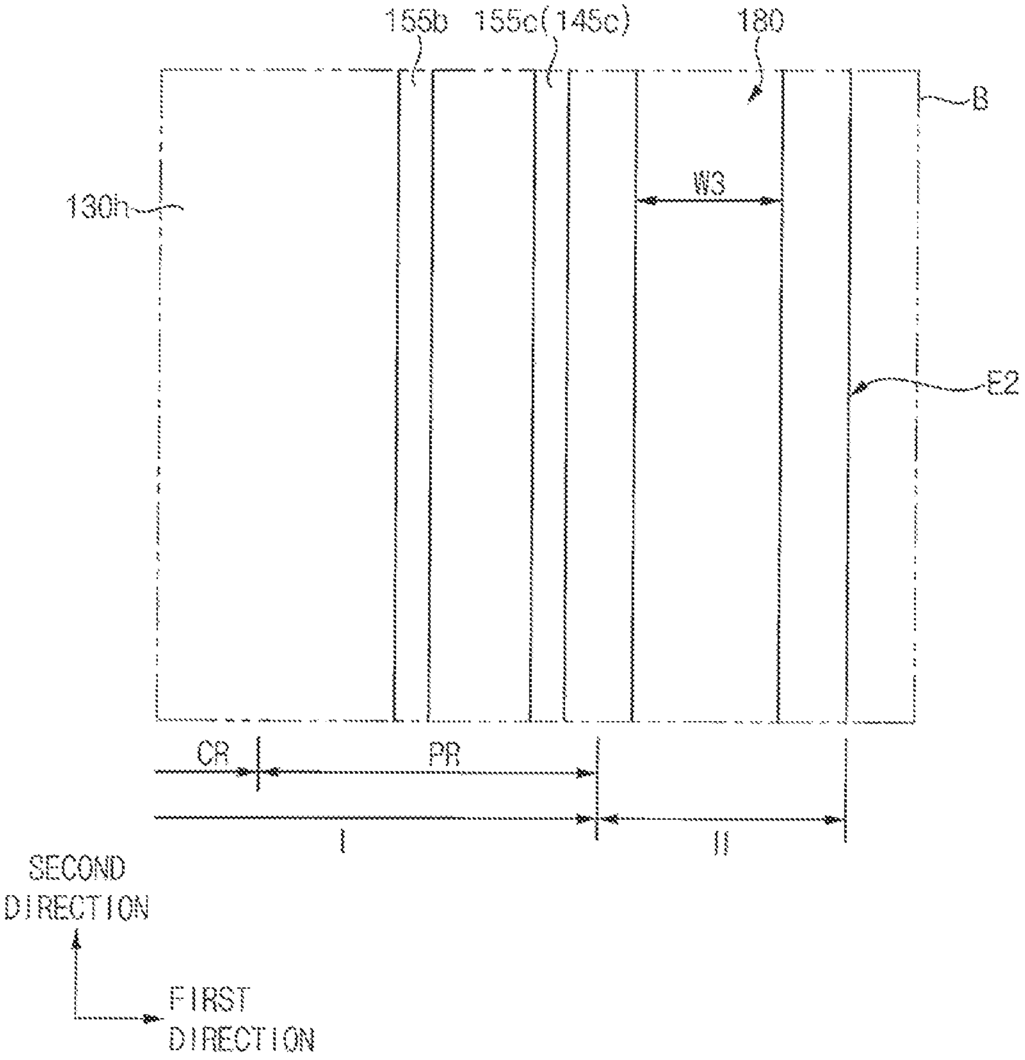
FIG. 5 is a plan view illustrating a portion of an eighth upper insulating layer of the metal wiring layer in FIG. 2 according to an example embodiment.

FIG. 1 is a plan view illustrating a semiconductor device according to an example embodiment. FIG. 2 is a cross-sectional view taken along the line A-A' in FIG. 1 according to an example embodiment. FIG. 3 is a plan view illustrating a portion of a second upper insulating layer of a metal wiring layer in FIG. 2 according to an example embodiment. FIG. 4 is a plan view illustrating a portion of a third upper insulating layer of the metal wiring layer in FIG. 2 according to an example embodiment. FIG. 5 is a plan view illustrating a portion of an eighth upper insulating layer of the metal wiring layer in FIG. 2 according to an example embodiment. FIGS. 3 to 5 are plan views illustrating a region overlapped with portion B' in FIG. 1.

Referring to FIGS. 1 to 5, a semiconductor device 100 may include a substrate 110, a plurality of insulating layers (e.g., insulating layers 120, 130 and 170), a first protection structure 140*b* as a moisture blocking structure, a second protection structure 140*c* as a crack stopper, and a trench 180.

In example embodiments, the substrate 110 may include a first surface 112 and a second surface 114 opposite to the first surface 112. The substrate 110 may include a die region I and a scribe lane region II surrounding the die region I. The die region I may include a circuit region CR in which circuit elements are formed and a protection region PR surrounding the circuit region CR. As will be described later, the first and second protection structures 140*b* and 140*c* for protecting the circuit elements may be formed on the protection region PR of the substrate 110. The substrate 110 may have a first edge E1, a second edge E2 opposite to the first edge E1, and third and fourth edges E3 and E4 adjacent to the first edge E1 and facing each other.

Two directions parallel with the first surface 112 of the substrate 110 and crossing each other may be defined as a first direction and a second direction. For example, the first direction and the second direction may cross each other orthogonally. The first edge E1 and the second edge E2 may extend along directions parallel with the second direction, and the third edge E3 and the fourth edge E4 may extend along directions parallel with the first direction.

The scribe lane region II of the substrate 110 may be a portion remaining after being removed by a sawing process among a scribe lane region in a wafer level. Accordingly, the scribe lane region II may surround the die region I of the substrate 110 and may be positioned along the edges E1, E2, E3 and E4 of the substrate 110.

Various elements, for example, a gate structure and an impurity region (source/drain layer), may be formed on the first surface 112 of the substrate 110 in the die region I. Examples of the elements may include a transistor, a diode, a resistor, an inductor, a capacitor, etc.

In example embodiments, the plurality of insulating layers may include an insulation interlayer 120, a metal wiring layer 130 and a passivation layer 170 sequentially stacked on the first surface 112 of the substrate 110.

The first protection structure 140*b* may extend along the edge of the substrate 110 on the protection region PR to surround the circuit region CR. The first protection structure 140*b* as the moisture blocking structure may prevent moisture from penetrating through the insulating layers and causing damages to the circuit elements.

The second protection structure 140*c* may extend on the protection region PR to surround the first protection structure 140*b*. The second protection structure 140*c* as the crack stopper may prevent a crack caused by a blade rotating at a high speed during the sawing process of a wafer from propagating to the circuit region CR of the substrate 110.

The trench 180 may extend from an upper surface of the insulating layers to a predetermined depth and extend along the edges of the substrate 110 to surround the second protection structure 140*c*. The trench 180 may prevent the crack caused by the blade from propagating through an upper portion of the insulating layers.

In particular, the first protection structure 140*b* may include a plurality of wiring layers 141*b*, 142*b*, 143*b*, 144*b* and 145*b* vertically stacked in the insulating layers on the protection region PR of the substrate 110. A first wiring layer 141*b*, which is a lowermost wiring layer among the wiring layers, may include a second contact plug 151*b* serving as a first via and a first metal wiring 161*b* stacked on the second contact plug 151*b*. Among the wiring layers, a second wiring layer 142*b* may include a second via 152*b* stacked on the first metal wiring 161*b* and a second metal wiring 162*b* stacked on the second via 152*b*. Among the wiring layers, a third wiring layer 143*b* may include a third via 153*b* stacked on the second metal wiring 162*b* and a third metal wiring 163*b* stacked on the third via 153*b*. Among the wiring layers, a fourth wiring layer 144*b* may include a fourth via 154*b* stacked on the third metal wiring 163*b* and a fourth metal wire 164*b* stacked on the fourth via 154*b*. A fifth wiring layer 145*b*, which is an uppermost wiring layer among the wiring layers, may include a fifth via 155*b* stacked on the fourth metal wiring 164*b* and a fifth metal wiring 165*b* stacked on the fifth via 155*b*.

The second protection structure 140*c* may include a plurality of wiring layers 141*c*, 142*c*, 143*c*, 144*c* and 145*c* vertically stacked in the insulating layers on the protection region PR of the substrate 110. A first wiring layer 141*c*, which is a lowest wiring layer among the wiring layers, may include a third contact plug 151*c* serving as a first via and a first metal wiring 161*c* stacked on the third contact plug 151*c*. Among the wiring layers, a second wiring layer 142*c* may include a second via 152*c* stacked on the first metal wiring 161*c* and a second metal wiring 162*c* stacked on the second via 152*c*. Among the wiring layers, a third wiring layer 143*c* may include a third via 153*c* stacked on the second metal wiring 162*c* and a third metal wiring 163*c* stacked on the third via 153*c*. Among the wiring layers, a fourth wiring layer 144*c* may include a fourth via 154*c* stacked on the third metal wiring 163*c*. A fifth wiring layer 145*c*, which is an uppermost wiring layer among the wiring layers, may include a fifth via 155*b* stacked on the fourth via 154*c*.

In example embodiments, the first protection structure 140*b* may include N (N being a natural number) wiring layers vertically stacked in the insulating layers, and the second protection structure 140*c* may include M (M being a natural number) wiring layers vertically stacked in the insulating layers. In this embodiment, M may be 5, and N may be 5. Alternatively, M may be less than N, M may be greater than N, etc.

Although five wiring layers and one via in each wiring layer are illustrated in the drawings, it may be understood that the number and arrangement of the wiring layers and the vias are provided by way of example, and it may not limited thereto.

In example embodiments, the uppermost wiring layer 145*b* of the moisture blocking structure 140*b* may have a first height H1 from the first surface of the substrate 110, and the uppermost wiring layer 145*c* of the crack stopper 140*c* may have a second height H2 smaller than the first height H1 from the first surface of the substrate 110.

Since the uppermost wiring layer 145*c* of the crack stopper 140*c* does not include the fifth metal wiring, the second height H2 of the uppermost wiring layer 145*c* of the crack stopper 140*c* may be smaller than the first height H1 of the uppermost wiring layer 145*b* of the moisture blocking structure 140*b*.

In example embodiments, the trench 180 may be formed in the passivation layer 170 and a portion of the metal wiring layer 130 to surround the die region I. The trench 180 may be formed to penetrate the passivation layer 170 and extend to a portion of the metal wiring layer 130. The trench 180 may have a width of about 3 μm to about 5 μm. The trench 180 may have a depth of about 1 μm to about 3.5 μm from an upper surface of the passivation layer 170.

The trench 180 may be formed adjacent to the die region I. At least a portion of the trench 180 may overlap the crack stopper 140*c* in the protection region PR. The trench 180 may be formed to be spaced apart from the crack stopper 140*c*. The crack stopper 140*c* may not be exposed by the trench 180. A spacing distance between the trench 180 and the crack stopper 140*c* may be less than 1 μm.

For example, the fifth metal wiring 165*b* of the uppermost wiring layer 145*b* of the moisture blocking structure 140*b* may include aluminum, and the fifth via 155*c* of the uppermost wiring layer 145*c* of the crack stopper 140*c* may include tungsten. In this case, since the uppermost wiring layer 145*c* of the crack stopper 140*c* does not include the fifth metal wiring, even though the fifth via 155*c* of the uppermost wiring layer 145*c* of the crack stopper 140*c* is exposed by the trench 180 formed to be relatively larger, it may be possible to prevent a defect in damage due to aluminum in a following bump forming process.

In example embodiments, at least some of the first to fifth vias 151*b*, 152*b*, 153*b*, 154*b* and 155*b* of the moisture blocking structure 140*b* may have a linear type via structure extending in one direction. At least some of the first to fifth vias 151*b*, 152*b*, 153*b*, 154*b* and 155*b* of the moisture blocking structure 140*b* may extend to surround the circuit region CR to form a barrier wall.

The first to third vias 151*c*, 152*c* and 153*c* of the crack stopper 140*c* may have a dot type via structure. The first to third vias 151*c*, 152*c* and 153*c* of the crack stopper 140*c* may be formed along one direction in the protection region PR to be spaced apart from each other.

The fourth and fifth vias 154*c* and 155*c* of the crack stopper 140*c* may have a linear type via structure extending in one direction. The fourth and fifth vias 154*c* and 155*c* of the crack stopper 140*c* may extend to surround the circuit region CR to form a barrier wall.

As illustrated in FIG. 3, the second via 152*b* of the moisture blocking structure 140*b* may have a linear type via structure extending in one direction. The second via 152*b* of the moisture blocking structure 140*b* may extend to surround the circuit region CR within the protection region PR to form a barrier wall. The second via 152*c* of the crack stopper 140*c* may have a dot type via structure. The second vias 152*c* of the crack stopper 140*c* may be formed to be spaced apart from each other in one direction in the protection region PR.

As illustrated in FIG. 4, the third metal wiring 163*b* of the moisture blocking structure 140*b* may have a linear shape extending in one direction. The third metal wiring 163*b* of the moisture blocking structure 140*b* may extend to surround the circuit region CR in the protection region PR to form a barrier wall. The third metal wiring 162*c* of the crack stopper 140*c* may have a linear shape extending in one direction. The third metal wiring 163*c* of the crack stopper 140*c* may extend to surround the third metal wiring 163*b* of the moisture blocking structure 140*b* in the protection region PR.

For example, the third metal wiring 163*b* of the moisture blocking structure 140*b* may have a width W1 of about 1 μm to about 3 μm. The third metal wiring 163*c* of the crack stopper 140*c* may have a width W3 of about 0.5 μm to about 1.5 μm.

As illustrated in FIG. 5, the fifth via 155*b* of the moisture blocking structure 140*b* may have a linear type via structure extending in one direction. The fifth via 155*b* of the moisture blocking structure 140*b* may extend to surround the circuit region CR in the protection region PR to form a barrier wall. The fifth via 155*c* of the crack stopper 140*c* may have a linear type via structure extending in one direction. The fifth via 155*c* of the crack stopper 140*c* may extend to surround the fifth via 155*b* of the moisture blocking structure 140*b* in the protection region PR.

In example embodiments, the semiconductor device 100 may further include a metal wiring structure 140*a* provided in the plurality of insulating layers 120, 130 and 170 on the substrate 110.

The metal wiring structure 140*a* may include a plurality of wiring layers 141*a*, 142*a*, 143*a*, 144*a* and 145*a* vertically stacked in the insulating layers on the circuit region CR of the substrate 110. A first wiring layer 141*b*, which is a lowermost wiring layer among the wiring layers, may include a first contact plug 151*a* in contact with an impurity region of the substrate 110 and a first metal wiring 161*a* stacked on the first contact plug 151*a*. A fifth metal wiring 165*a* of a fifth wiring layer 145*a*, which is an uppermost wiring layer among the wiring layers, may serve as a bonding pad on which a conductive bump is disposed.

The conductive bump may be disposed on the fifth metal wiring 165*a* exposed by the passivation layer 170. The semiconductor device 100 may be mounted on a package substrate or stacked on another semiconductor device via the conductive bump.

An area of the protection region PR may be determined according to sizes of the moisture blocking 140*b* and the crack stopper 140*c*. For example, a width of the protection region PR in the first direction or the second direction may be within a range of about 3 μm to about 6 μm.

As mentioned above, the semiconductor device 100 may include the substrate 110 having the circuit region CR, the plurality of insulating layers 120, 130 and 170 sequentially stacked on the substrate 110, the moisture blocking structure 140*b* extending to surround the circuit region CR and including a plurality of wiring layers 141*b*, 142*b*, 143*b*, 144*b* and 145*b* vertically stacked in the insulating layers, the crack stopper 140*c* extending to surround the moisture blocking structure 140*b* and including a plurality of wiring layers 141*c*, 142*c*, 143*c*, 144*c* and 145*c* vertically stacked in the insulating layers, and the trench 180 extending along the edge of the substrate to surround the crack stopper 140*c* and having the predetermined thickness from the upper surface of the insulating layers.

The uppermost wiring layer 145*b* of the moisture blocking structure 140*b* may include the via 155*b* and the metal wiring 165*b* stacked on the via 155*b*, and the uppermost wiring layer 145*c* of the crack stopper 140*c* may include the via 155*c*. The uppermost wiring layer 145*b* of the moisture blocking structure 140*b* may have the first height H1 from the surface of the substrate 110, and the uppermost wiring layer 145*c* of the crack stopper 140*c* may have the second height H2 less than the first height H1 from the surface of the substrate 110.

The metal wiring 165*b* of the uppermost wiring layer 145*b* of the moisture blocking structure 140*b* may include aluminum, and the via 155*c* of the uppermost wiring layer 145*c* of the crack stopper 140*c* may include tungsten. In this case, since the uppermost wiring layer 145*c* of the crack stopper 140*c* does not include the metal wiring, even though the via 155*c* of the uppermost wiring layer 145*c* of the crack stopper 140*c* is exposed by the trench 180 formed to be relatively larger, it may be possible to prevent a defect in damage due to aluminum in a following bump forming process.

Accordingly, even when the trench 180 is formed to be large in size in order to prevent cracks, defects in the bump forming process may be prevented. Further, since a distance between the trench 180 and the crack stopper 140*c* can be reduced, the sizes of the moisture blocking structure 140*b* and the crack stopper 140*c* may be reduced to thereby reduce the area of the protection region PR.

Hereinafter, a method of manufacturing the semiconductor device in FIG. 1 will be explained.

FIGS. 6, 7, 8, 9, 10, 11, 12, 13, 14 and to 15 are cross-sectional views illustrating a method of manufacturing a semiconductor device according to an example embodiment. FIGS. 7 to 14 include cross-sections cut along the line C-C' in FIG. 6. FIG. 15 includes a cross-section cut along the line D-D' in FIG. 6.

Figure 6:
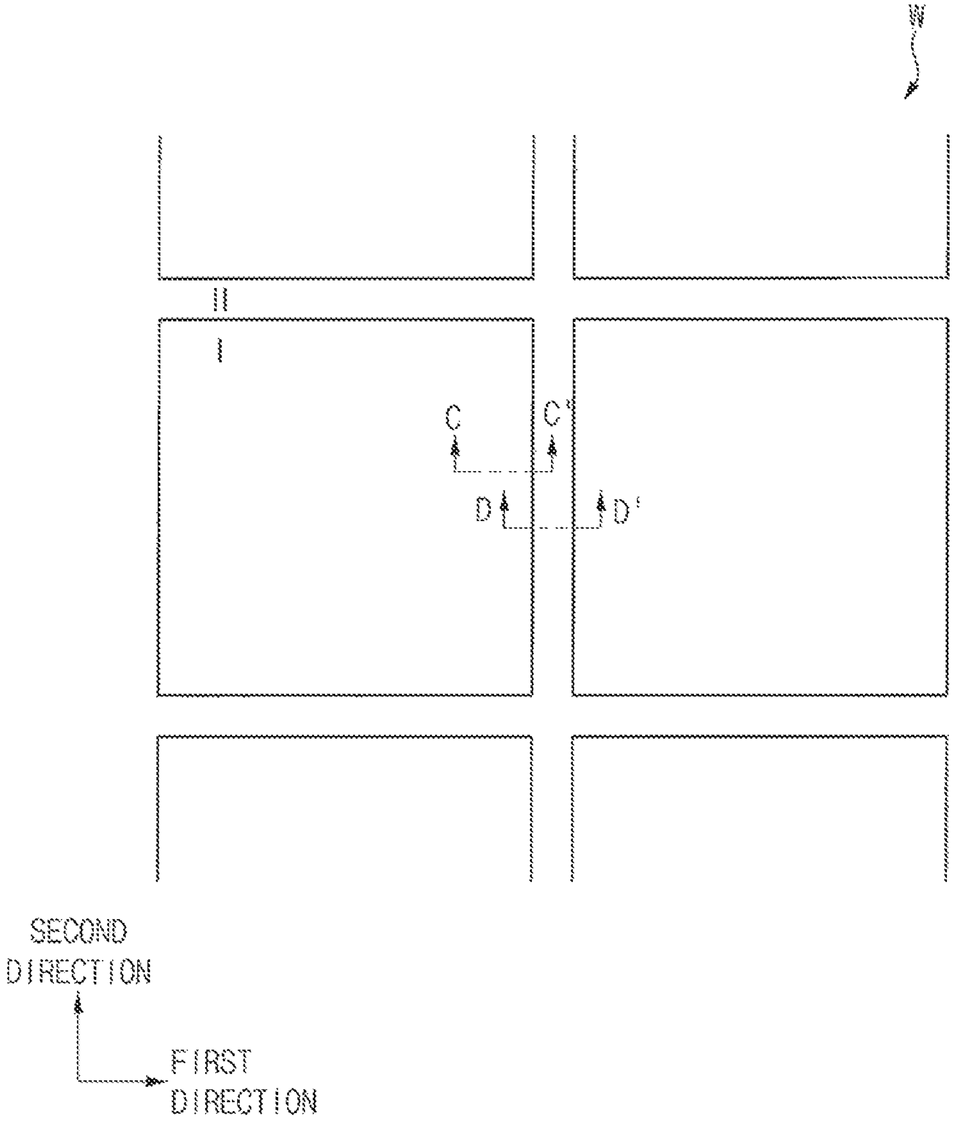
FIGS. 6, 7, 8, 9, 10, 11, 12, 13, 14 and 15 are cross-sectional views illustrating a method of manufacturing a semiconductor package according to an example embodiment.
Figure 7:
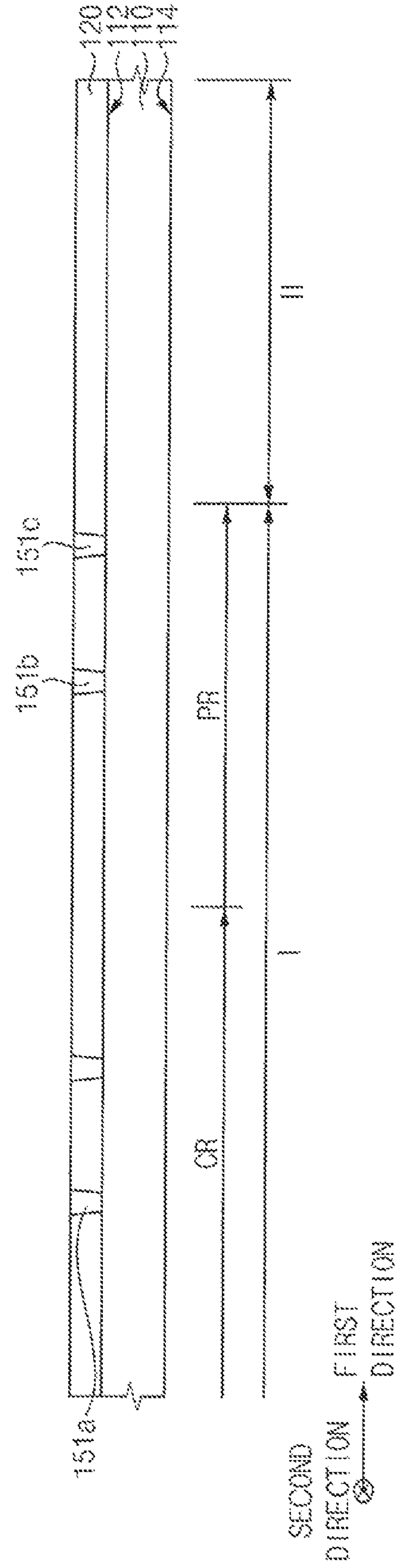

Referring to FIGS. 6 and 7, a substrate 110 such as a wafer W having a die region I and a scribe lane region II surrounding the die region I may be provided.

In example embodiments, the substrate 110 may include a first surface 112 and a second surface 114 opposite to the first surface 112. The substrate 110 may include the die region I and the scribe lane region II surrounding the die region I. The die region I may include a circuit region CR in which circuit elements are formed and a protection region PR surrounding the circuit region CR. As will be described later, protection structures for protecting the circuit elements may be formed in the protection region PR of the substrate 110. In addition, the substrate 110 may be sawed along the scribe lane region II dividing a plurality of the die regions I by a following sawing process.

For example, the substrate 110 may include may include silicon, germanium, silicon-germanium, or III-V compounds, e.g., GaP, GaAs, GaSb, etc. In some embodiments, the substrate 110 may be a silicon-on-insulator (SOI) substrate, or a germanium-on-insulator (GOT) substrate.

The circuit region CR may include a cell region (not illustrated) in which memory cells are formed and a peripheral circuit region (not illustrated) in which peripheral circuits for driving the memory cells are formed. Alternatively, the circuit region CR may include a logic region in which logic elements are formed.

The circuit element may include a plurality of memory elements. Examples of the memory element include a volatile semiconductor memory element and a non-volatile semiconductor memory element. Examples of the volatile semiconductor memory element may be dynamic random access memory (DRAM), static RAM (SRAM), etc. Examples of the non-volatile semiconductor memory element may be erasable programmable read-only memory (EPROM), electrically EPROM (EEPROM), Flash EEPROM, etc.

A transistor, as the circuit element, may be formed by a following method.

After sequentially forming a gate insulating layer and a gate electrode layer on the first surface 112 of the substrate 110 in which an isolation layer is formed, the gate electrode layer and the gate insulating layer may be patterned by a photolithography process to form a gate structure including a gate insulating layer pattern and a gate electrode sequentially stacked in the first region I of the substrate 110. The gate insulating layer may be formed of an oxide such as silicon oxide or metal oxide, and the gate electrode layer may be formed of doped polysilicon, metal, metal nitride, and/or metal silicide.

A gate spacer layer covering the gate structure may be formed on the first surface 112 of the substrate 110 and the isolation layer and then etched by an anisotropic etching process to form a gate spacer on a sidewall of the gate structure. The gate spacer layer may be formed to include, for example, a nitride such as silicon nitride.

An impurity may be doped into the substrate 110 adjacent to the gate structure through an ion implantation process to form an impurity region, to thereby form the transistor including the gate structure and the impurity region.

Accordingly, the circuit patterns may be formed on the substrate 110 by performing a wafer process called a front-end-of-line (FEOL) process.

In example embodiments, a plurality of the transistors may be formed in the first region I of the substrate 110. The circuit element may not be limited to the transistor, and various elements such as a diode, a resistor, an inductor, a capacitor, etc. may be further formed as the circuit element.

As illustrated in FIG. 7, an insulation interlayer 120 may be formed on the first surface 112 of the substrate 110 to cover the circuit elements, and contact plugs 151*a*, 151*b* and 151*c* may be formed to penetrate the insulation interlayer 120.

For example, the insulating interlayer 120 may be formed to include an oxide such as silicon oxide. A contact hole may be formed to penetrate the insulation interlayer 120 and to partially expose a region on the substrate 110 and the contact hole may be filled up with a conductive material to form the contact plug. The conductive material may include, for example, metal, metal nitride, metal silicide, doped polysilicon, or the like. The contact plug may include a barrier metal and a metal layer.

The first contact plug 151*a* may be formed in the circuit region CR of the substrate 110 to be in contact with the impurity region of the substrate 110. As will be described later, the second and third contact plugs 151*b* and 151*c* may be formed in the protection region PR of the substrate 110, the second contact plug 151*b* formed relatively further inside among the second and third contact plugs 151*b* and 151*c* may serves as a via of a lowermost wiring layer of a moisture blocking structure, and the third contact plug 151*c* formed relatively further outside among the second and third contact plugs 151*b* and 151*c* may serve as a via of a lowest wiring layer of a crack stopper.

When viewed in plan view, the second contact plug 151_b_ may have a linear type via structure extending in one direction. The second contact plug 151_b_ may extend to surround the circuit region CR within the protection region PR to form a barrier wall. The third contact plug 151_c_ may have a dot type via structure. The third contact plugs 151_c_ may be formed to be spaced apart from each other along one direction in the protection region PR.

Hereinafter, an upper metal wiring layer may be formed on the first surface of the substrate 110. The upper metal wiring layer may be formed by performing a wiring process called a back-end-of-line (BEOL) process.

Figure 8:
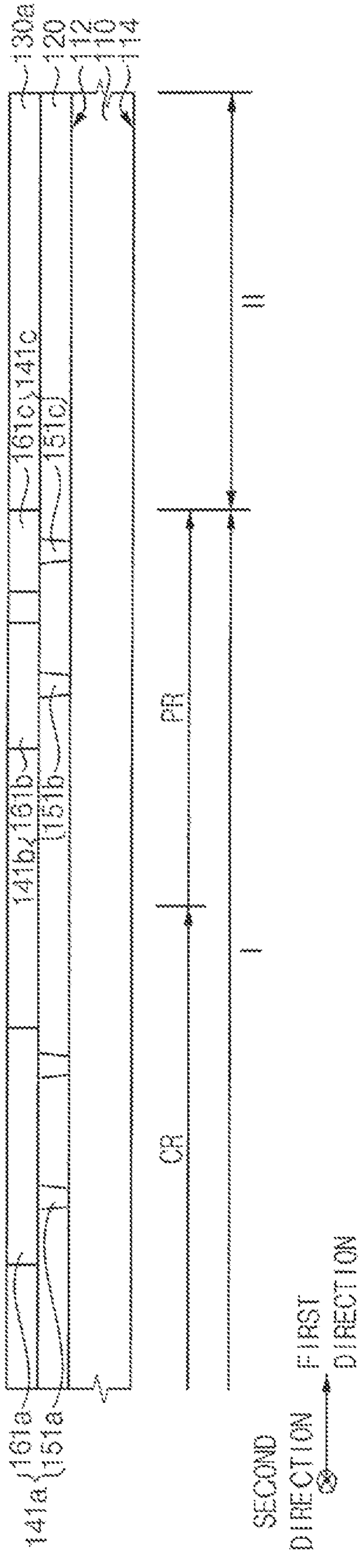

Referring to FIG. 8, a first upper insulating layer 130_a_ may be formed on the insulation interlayer 120, and first metal wirings 161_a_, 161_b_ and 161_c_ may be formed to penetrate the first upper insulating layer 130_a_ and may be electrically connected to the contact plugs.

For example, the first upper insulating layer 130_a_ may be formed to include an oxide such as silicon oxide, carbon-doped oxide, fluorine-doped oxide, etc. The first metal wiring may be formed by forming a via hole that penetrates the first upper insulating layer 130_a_ and exposes the contact plug and filling the via hole with a conductive material. The conductive material may include a metal material such as aluminum, copper, etc.

In this case, an etch stop layer may be formed between the insulation interlayer 120 and the first upper insulating layer 130_a_. The etch stop layer may include a nitride-based insulating layer such as SiN, SiON, BN, etc., or a carbon-based insulating layer such as SiC. The etch stop layer may serve to stop etching of the underlying insulation interlayer when the via hole is formed and to suppress diffusion of the metal material from the first metal wiring.

The first metal wiring 161_a_ formed in the circuit region CR of the substrate 110 may be electrically connected to the first contact plug 151_a_. The first metal wiring 161_b_ formed relatively further inside the protective region PR of the substrate 110 may be electrically connected to the second contact plug 151_b_ and may serve as a metal wiring of the lowermost wiring layer of the moisture blocking structure. The first metal wiring 161_c_ formed relatively further outside the protection region PR of the substrate 110 may be electrically connected to the third contact plug 151_c_ and may serve as a metal wiring of the lowermost wiring layer of the crack stopper. Accordingly, the lowermost wiring layer 141_b_ of the moisture blocking structure may include the first via 151_b_ and the first metal wiring 161_b_ stacked on the first via 151_b_, and the lowermost wiring layer 141_c_ of the crack stopper may include the first via 151_c_ and the first metal wiring 161_c_ stacked on the first via 151_c_.

When viewed in a plan view, the first metal wiring 161_a_ may have an isolated shape. The first metal wiring 161_b_ of the first protection structure may have a linear shape extending in one direction. The first metal wiring 161_b_ of the first protection structure may extend to surround the circuit region CR within the protection region PR to form a barrier wall. The first metal wiring 161_c_ of the second protection structure may have a linear shape extending in one direction. The first metal wiring 161_c_ of the second protection structure may extend to surround the first metal wiring 161_b_ of the first protection structure within the protection region PR.

For example, the first metal wiring 161_b_ of the first protection structure may have a width of about 1 μm to about 3 μm. The first metal wiring 161_c_ of the second protection structure may have a width of about 0.5 μm to about 1.5 μm.

Figure 9:
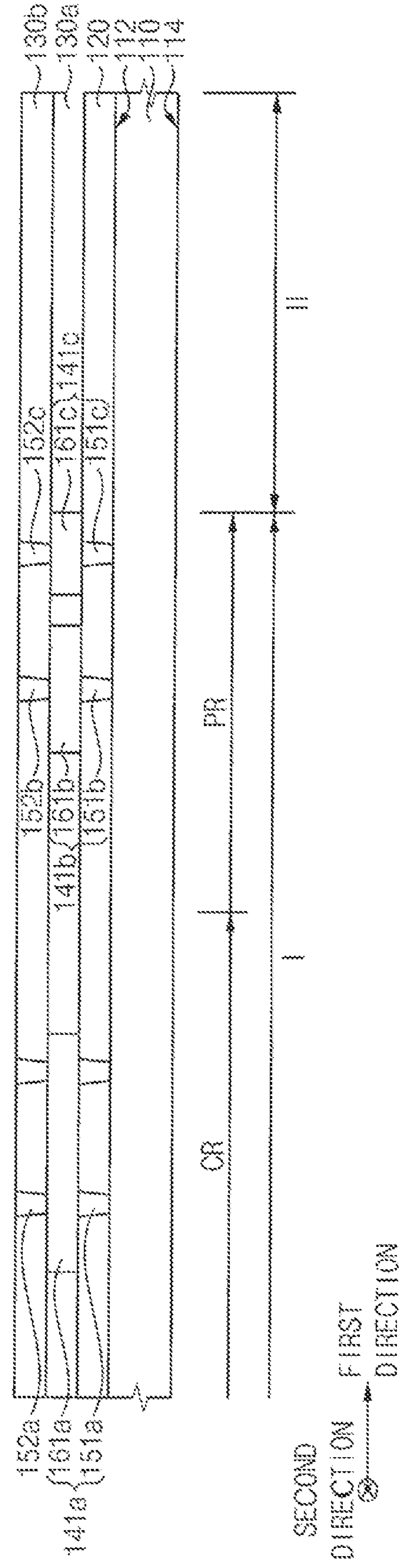

Referring to FIG. 9, a second upper insulating layer 130_b_ may be formed on the first upper insulating layer 130_a_, and second vias 152_a_, 152_b_ and 152_c_ may be formed to penetrate the second upper insulating layer 130_b_ and may be electrically connected to the first metal wirings.

For example, the second upper insulating layer 130_b_ may be formed to include an oxide such as silicon oxide, carbon-doped oxide, fluorine-doped oxide, etc. The second via may be formed by forming a via hole that penetrates the second upper insulating layer 130_b_ and exposes at least a portion of the first metal wiring and filling the via hole with a conductive material. The conductive material may include a metal material such as aluminum, copper, tungsten, etc.

The second via 152_a_ may be formed in the circuit region CR of the substrate 110 to be in contact with the first metal wiring 161_a_. The second via 152_b_ formed relatively further inside the protection region PR of the substrate 110 may be electrically connected to the first metal wiring 161_b_ and may serves as a via of a second wiring layer of the moisture blocking structure, and the second via 152_c_ formed relatively further outside the protection region PR of the substrate 110 may be electrically connected to the first metal wiring 161_c_ and may serve as a via of a second wiring layer of the crack stopper.

When viewed in plan view, the second via 152_a_ may have a dot type via structure. The second via 152_b_ of the first protection structure may have a linear type via structure extending in one direction. The second via 152_b_ may extend to surround the circuit region CR within the protection region PR to form a bather wall. The second via 152_c_ of the second protection structure may have a dot type via structure. The second vias 152_c_ of the second protection structure may be formed to be spaced apart from each other along one direction in the protection region PR.

Figure 10:
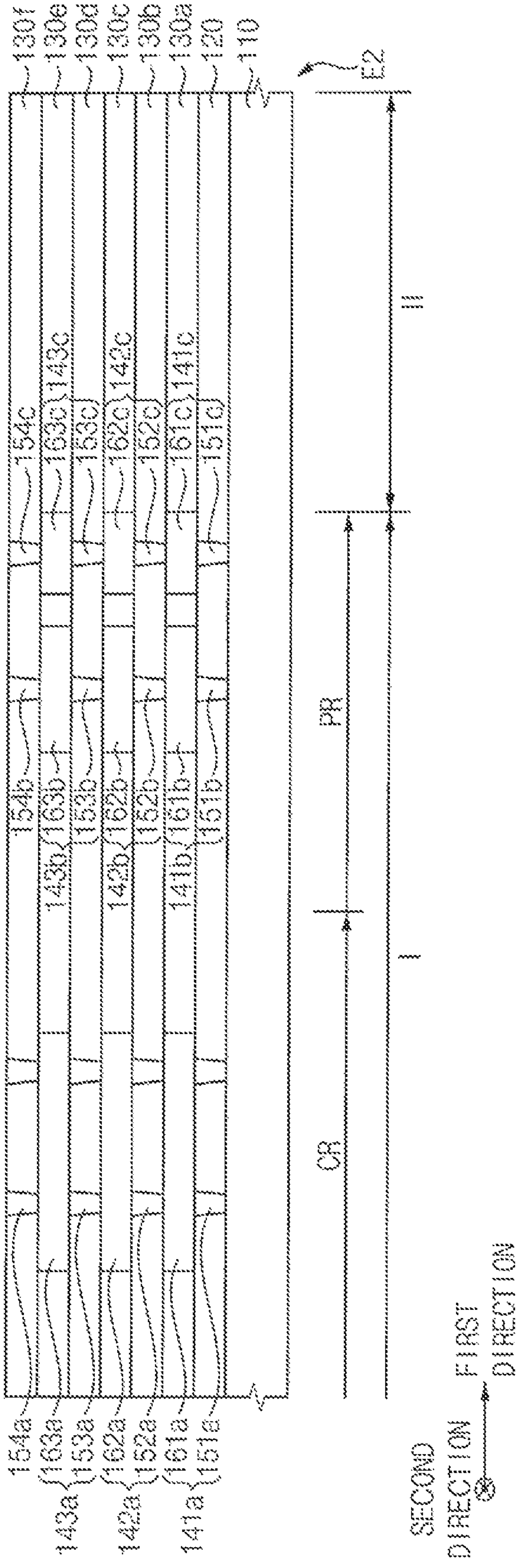

Referring to FIG. 10, processes the same as or similar to the processes described with reference to FIGS. 8 and 9 may be performed to form second metal wirings 162_a_, 162_b_ and 162_c_, third vias 153_a_, 153_b_ and 153_c_, third metal wirings 163_a_, 163_b_ and 163_c_ and fourth vias 154_a_, 154_b_ and 154_c_ in third to sixth upper insulating layers 130_c_, 130_d_, 130_e_ and 130_f_ respectively.

The second metal wiring 162_a_ formed in the circuit region CR of the substrate 110 may be electrically connected to the second via 152_a_. The second metal wiring 162_b_ formed relatively further inside the protective region PR of the substrate 110 may be electrically connected to the second via 152_b_ and may serve as a metal wiring of the second wiring layer of the moisture blocking structure. The second metal wiring 162_c_ formed relatively further outside the protection region PR of the substrate 110 may be electrically connected to the second via 152_c_ and may serve as a metal wiring of the second wiring layer of the crack stopper. Accordingly, the second wiring layer 142_b_ of the moisture blocking structure may include the second via 152_b_ and the second metal wiring 162_b_ stacked on the second via 152_b_, and the second wiring layer 142_c_ of the crack stopper may include the second via 152_c_ and the second metal wiring 162_c_ stacked on the second via 152_c_.

The third via 153_a_ may be formed in the circuit region CR of the substrate 110 to be in contact with the second metal wiring 162_a_. The third via 153_b_ formed relatively further inside the protection region PR of the substrate 110 may be electrically connected to the second metal wiring 162_b_ and may serves as a via of a third wiring layer of the moisture blocking structure, and the third via 153_c_ formed relatively further outside the protection region PR of the substrate 110 may be electrically connected to the second metal wiring 162_c_ and may serve as a via of a third wiring layer of the crack stopper.

The third metal wiring 163*a* formed in the circuit region CR of the substrate 110 may be electrically connected to the third via 153*a*. The third metal wiring 163*b* formed relatively further inside the protective region PR of the substrate 110 may be electrically connected to the third via 153*b* and may serve as a metal wiring of the third wiring layer of the moisture blocking structure. The third metal wiring 163*c* formed relatively further outside the protection region PR of the substrate 110 may be electrically connected to the third via 153*c* and may serve as a metal wiring of the third wiring layer of the crack stopper. Accordingly, the third wiring layer 143*b* of the moisture blocking structure may include the third via 153*b* and the third metal wiring 163*b* stacked on the third via 153*b*, and the third wiring layer 143*c* of the crack stopper may include the third via 153*c* and the third metal wiring 163*c* stacked on the third via 153*c*.

The fourth via 154*a* may be formed in the circuit region CR of the substrate 110 to be in contact with the third metal wiring 163*a*. The fourth via 154*b* formed relatively further inside the protection region PR of the substrate 110 may be electrically connected to the third metal wiring 163*b* and may serves as a via of a fourth wiring layer of the moisture blocking structure, and the fourth via 154*c* formed relatively further outside the protection region PR of the substrate 110 may be electrically connected to the third metal wiring 163*c* and may serve as a via of a fourth wiring layer of the crack stopper.

When viewed in plan view, the fourth via 154*a* may have a dot type via structure. The fourth via 154*b* of the first protection structure may have a linear type via structure extending in one direction. The fourth via 154*b* of the first protection structure may extend to surround the circuit region CR within the protection region PR to form a barrier wall. The fourth via 154*c* of the second protection structure may have a linear type via structure. The fourth via 154*c* of the second protection structure may extend within the protection region PR to surround the fourth via 154*b* of the first protection structure to form a barrier wall.

Figure 11:
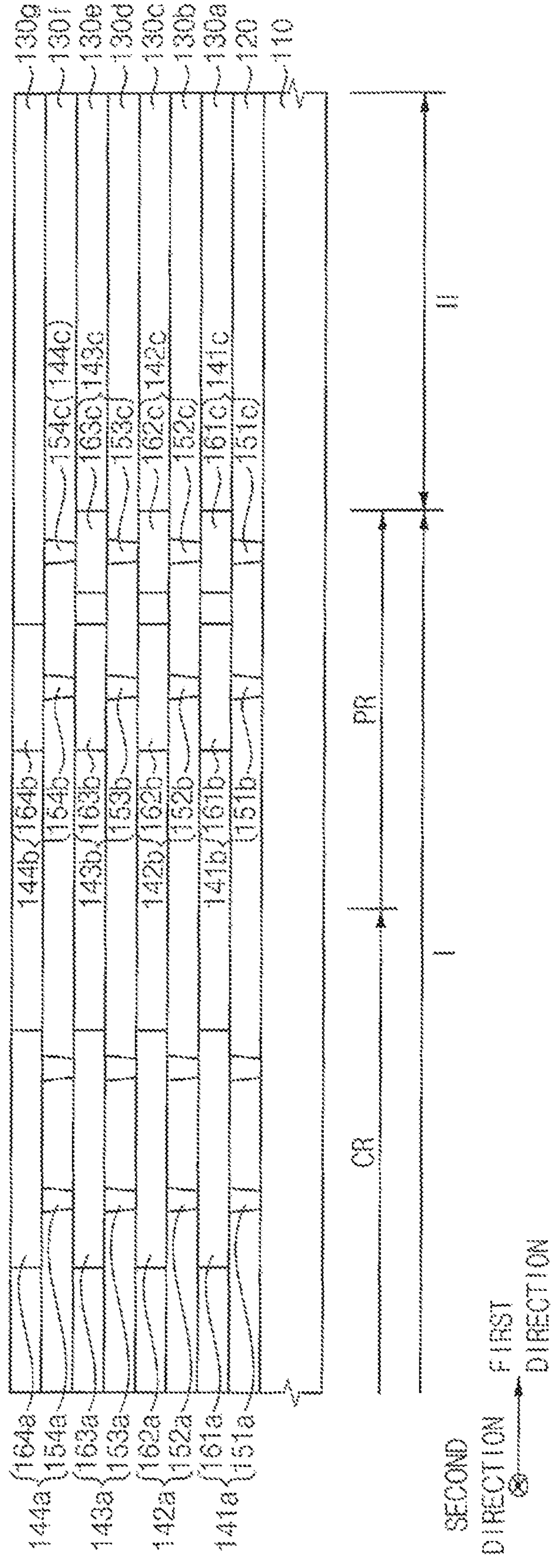

Referring to FIG. 11, a seventh upper insulating layer 130*g* may be formed on the sixth insulating layer 130*f*, and fourth metal wirings 164*a* and 164*b* may be formed to penetrate the seventh upper insulating layer 130*g* and may be electrically connected to the fourth vias 154*a* and 154*b*.

In example embodiments, the fourth metal wiring 164*a* formed in the circuit region CR of the substrate 110 may be electrically connected to the fourth via 154*a*. The fourth metal wiring 164*b* formed relatively further inside the protective region PR of the substrate 110 may be electrically connected to the fourth via 154*b* and may serve as a metal wiring of a fourth wiring layer of the moisture blocking structure. A metal wiring may not be formed on the fourth via 154*c* formed in the protection region PR of the substrate 110. Accordingly, the fourth wiring layer 144*b* of the moisture blocking structure may include the fourth via 154*b* and the fourth metal wiring 164*b* stacked on the fourth via 154*b*, and the fourth wiring layer 144*c* of the crack stopper may include only the fourth via 154*c*.

Figure 12:
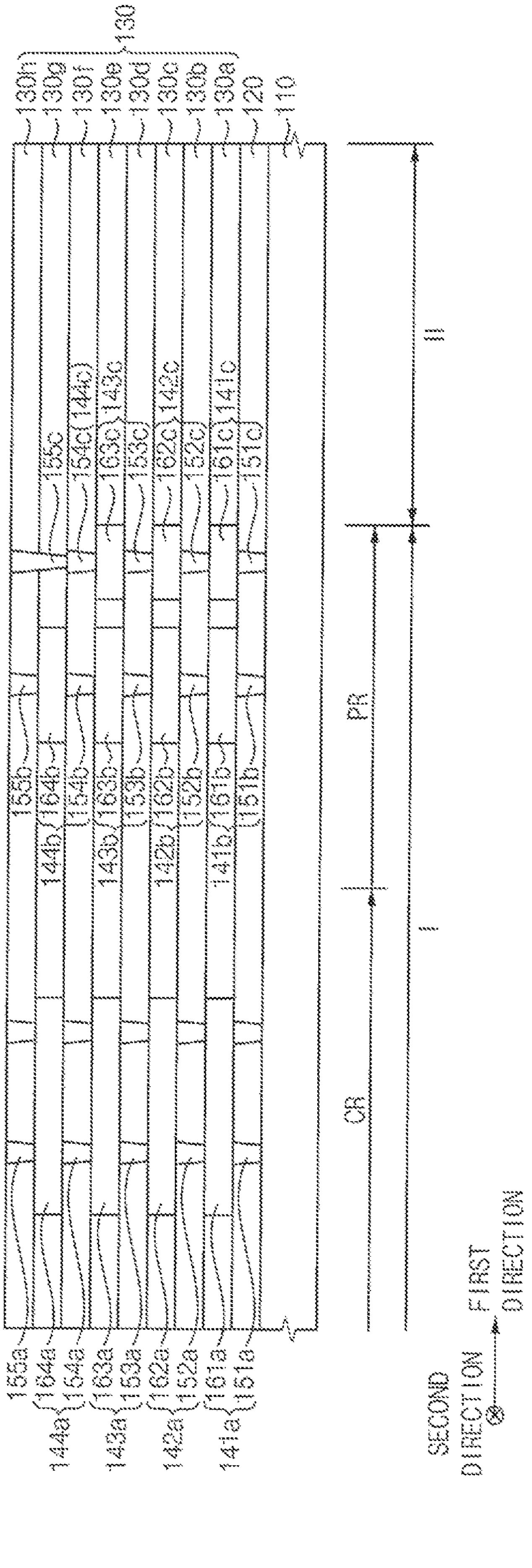

Referring to FIG. 12, an eighth upper insulating layer 130*h* may be formed on the seventh insulating layer 130*g*, and fifth vias 155*a*, 155*b* and 155*c* may be formed to penetrate the eighth upper insulating layer 130*g*.

In example embodiments, the fifth via 155*a* may be formed in the circuit region CR of the substrate 110 to be in contact with the fourth metal wiring 164*a*. The fifth via 155*b* formed relatively further inside the protection region PR of the substrate 110 may be electrically connected to the fourth metal wiring 164*b* and may serves as a via of a fifth wiring layer of the moisture blocking structure. The fifth via 155*c* formed relatively further outside the protection region PR of the substrate 110 may be electrically connected to the fourth via 154*c* and may serve as a via of a fifth wiring layer of the crack stopper.

When viewed in plan view, the fifth via 155*a* may have a dot type via structure. The fifth via 155*b* of the first protection structure may have a linear type via structure extending in one direction. The fifth via 155*b* of the first protection structure may extend to surround the circuit region CR within the protection region PR to form a barrier wall. The fifth via 155*c* of the second protection structure may have a linear type via structure. The fifth via 155*c* of the second protection structure may extend to surround the fifth via 155*b* of the first protection structure within the protection region PR to form a barrier wall.

Accordingly, a metal wiring layer 130 including the first to eighth upper insulating layers 130*a* to 130*h* may be formed on the insulation interlayer 120 on the substrate 110.

Figure 13:
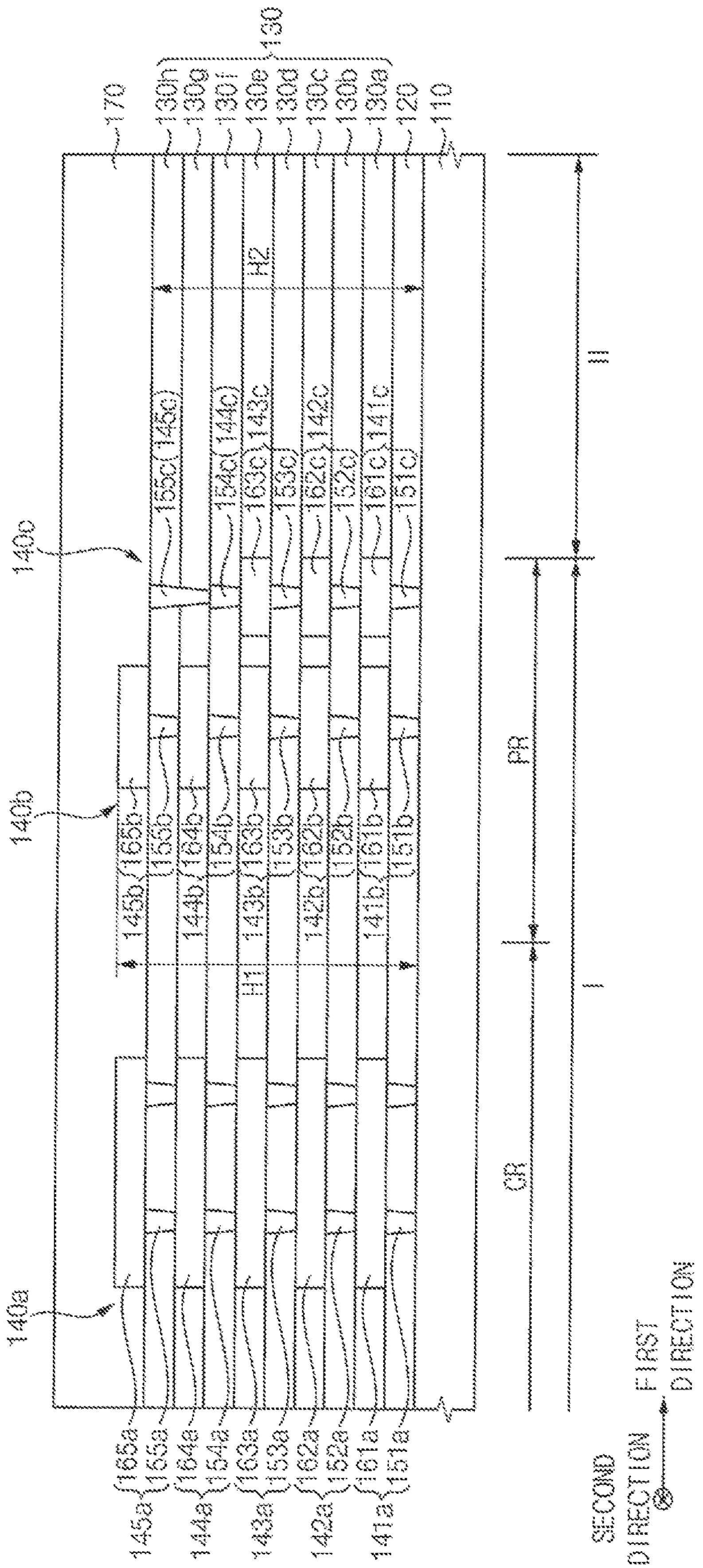

Referring to FIG. 13, fifth metal wirings 165*a* and 165*b* may be formed on the eighth upper insulating layer 130*h*, and a protective layer 170 may formed on the metal wiring layer 130 to cover the fifth metal wirings 165*a* and 165*b*.

In example embodiments, the fifth metal wiring 165*a* formed in the circuit region CR of the substrate 110 may be electrically connected to the fifth via 155*a* and may serve as a bonding pad on which a conductive bump is disposed. The fifth metal wiring 165*b* formed relatively further inside the protection region PR of the substrate 110 may be electrically connected to the fifth via 155*b* and may serve as a metal wiring of the fifth wiring layer of the moisture blocking structure. A metal wiring may not be formed on the fifth via 155*c* formed in the protection region PR of the substrate 110. Accordingly, the fifth wiring layer 145*b* of the moisture blocking structure may include the fifth via 155*b* and the fifth metal wiring 165*b* stacked on the fifth via 155*b*, and the fifth wiring layer 145*c* of the crack stopper may include only the fifth via 155*c*.

Thus, a metal wiring structure 140*a*, a moisture blocking structure 140*b* as the first protection structure, and a crack stopper 140*c* as the second protection structure may be formed in a plurality of insulating layers 120, 130 and 170 on the substrate 110.

Then, a passivation layer 170 (i.e., an insulating layer) may be formed over the entire surface of the substrate 110 to cover the fifth metal wirings 165*a* and 165*b*. The passivation layer 170 may include an organic passivation layer including an oxide layer and an inorganic passivation layer including a nitride layer sequentially stacked on each other.

Figure 14:
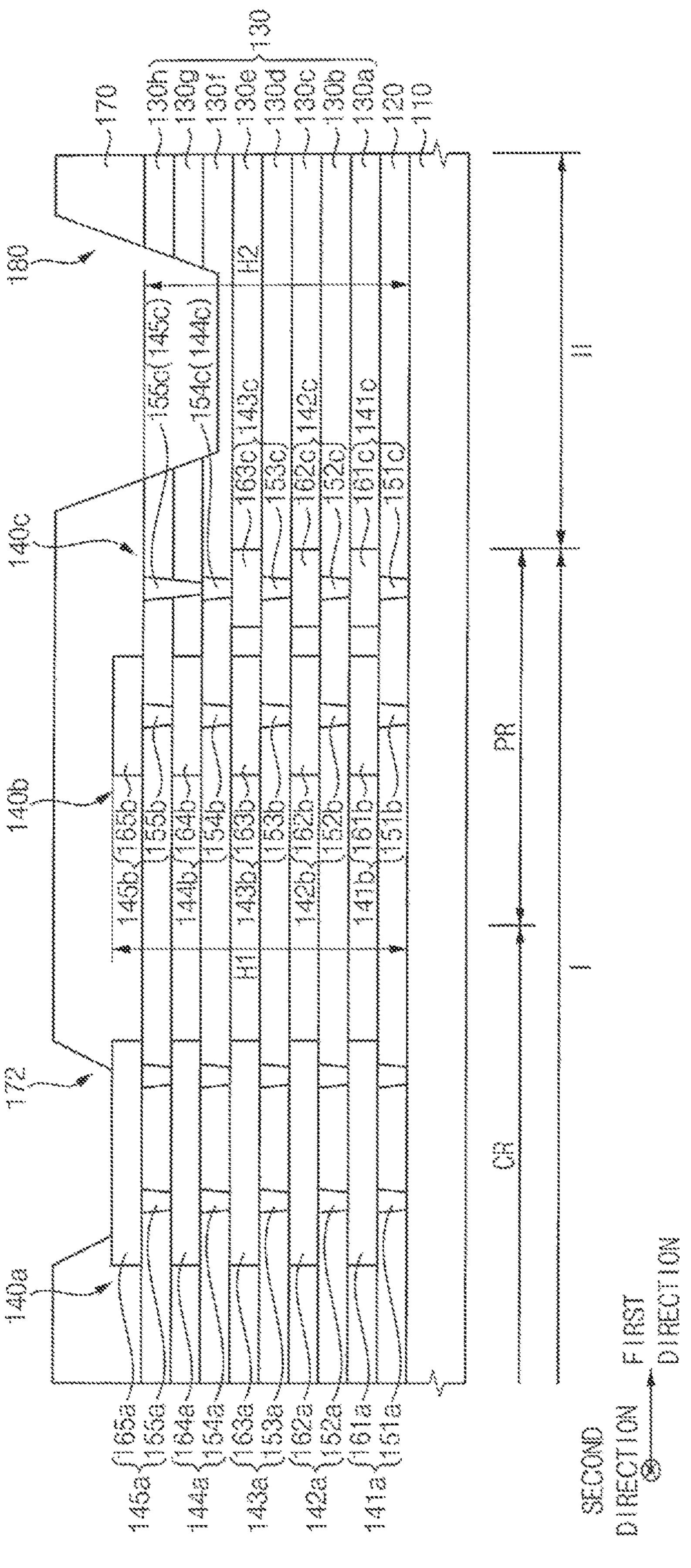
Figure 15:
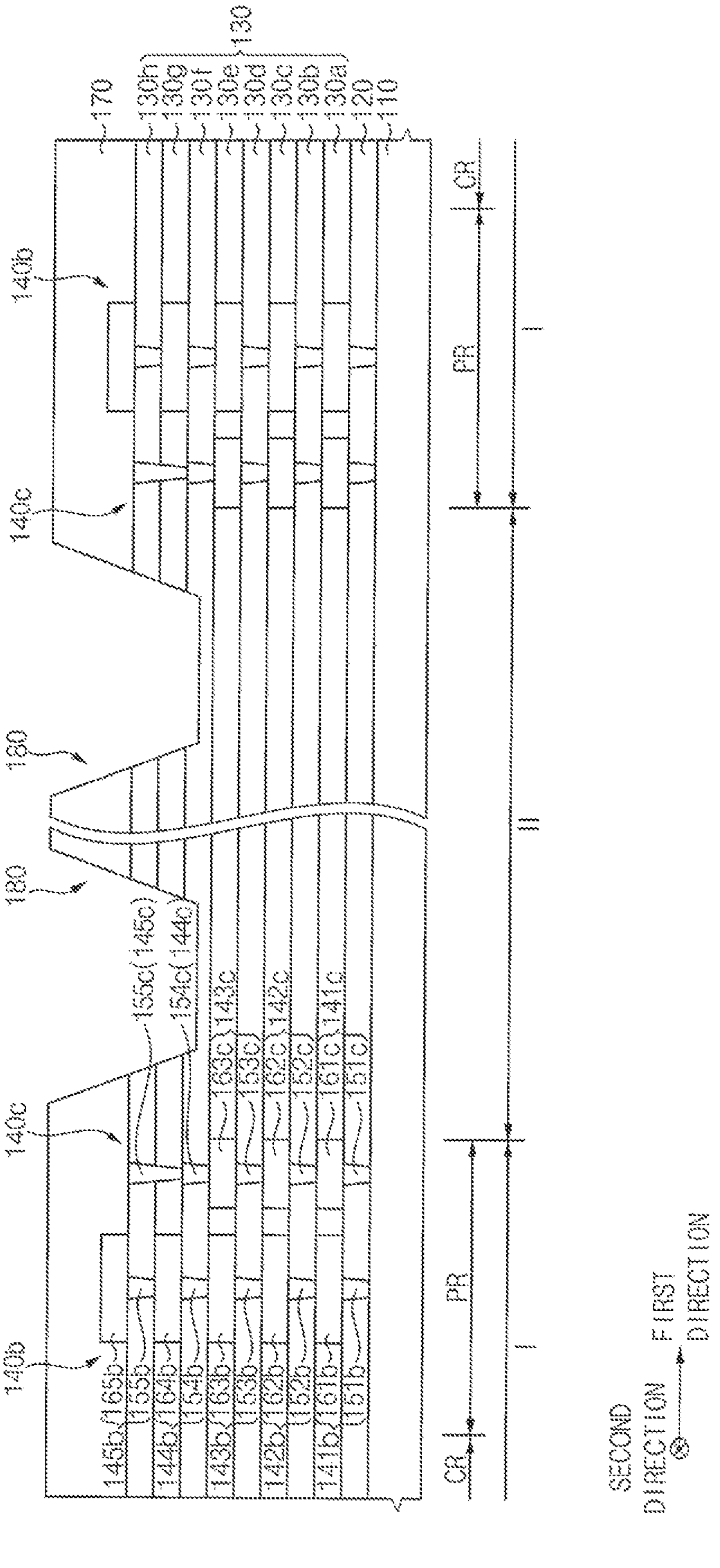

Referring to FIGS. 14 and 15, a trench 180 may be formed in the plurality of insulating layers 120, 130 and 170 in the scribe lane region II of the substrate 110.

In example embodiments, a photoresist pattern having first openings exposing a partial region of the circuit region CR and a partial region of the scribe lane region II may be formed on the passivation layer 170 on the substrate 110, and then, an etching process may be performed using the photoresist pattern as an etching mask to remove portions of the passivation layer 170. Accordingly, an opening 172 exposing the fifth metal wiring 165*a* formed in the circuit region CR may be formed in the passivation layer and the trench 180 may be formed in the passivation layer 170 and the portion of the metal wiring layer 130 in the scribe lane region II.

The trench 180 may be formed in the passivation layer 170 and the portion of the metal wiring layer 130 to surround the die region I. The trench 180 may be formed to penetrate the passivation layer 170 and extend to the portion of the metal wiring layer 130. The trench 180 may have a width of about 3 μm to about 5 nm. The trench 180 may have a depth of about 1 μm to about 3.5 μm from an upper surface of the passivation layer 170.

The trench 180 may be formed adjacent to the die region I. At least a portion of the trench 180 may overlap the crack stopper 140*c* in the protection region PR. Since the trench 180 is formed to be spaced apart from the crack stopper 140*c*, the crack stopper 140*c* may not be exposed by the trench 180. A spacing distance between the trench 180 and the crack stopper 140*c* may be less than 1 μm.

In example embodiments, the fifth metal wiring may include aluminum and the fifth via 155*c* may include tungsten. In this case, since the uppermost wiring layer 145*c* of the crack stopping structure 140*c* does not include the fifth metal wiring, even though a portion of the fifth via 155*c*, which is the uppermost wiring layer of the crack stopper 140*c*, is exposed by the trench 180 formed to be relatively larger, it may be possible to prevent a damage defect due to aluminum in a following bump forming process.

A method of forming the wiring layers may not be limited thereto. For example, it will be understood that the wiring layers may be formed using a single damascene process, a dual damascene process, or the like.

Hereinafter, a method for manufacturing a semiconductor package will be explained.

Figure 16:
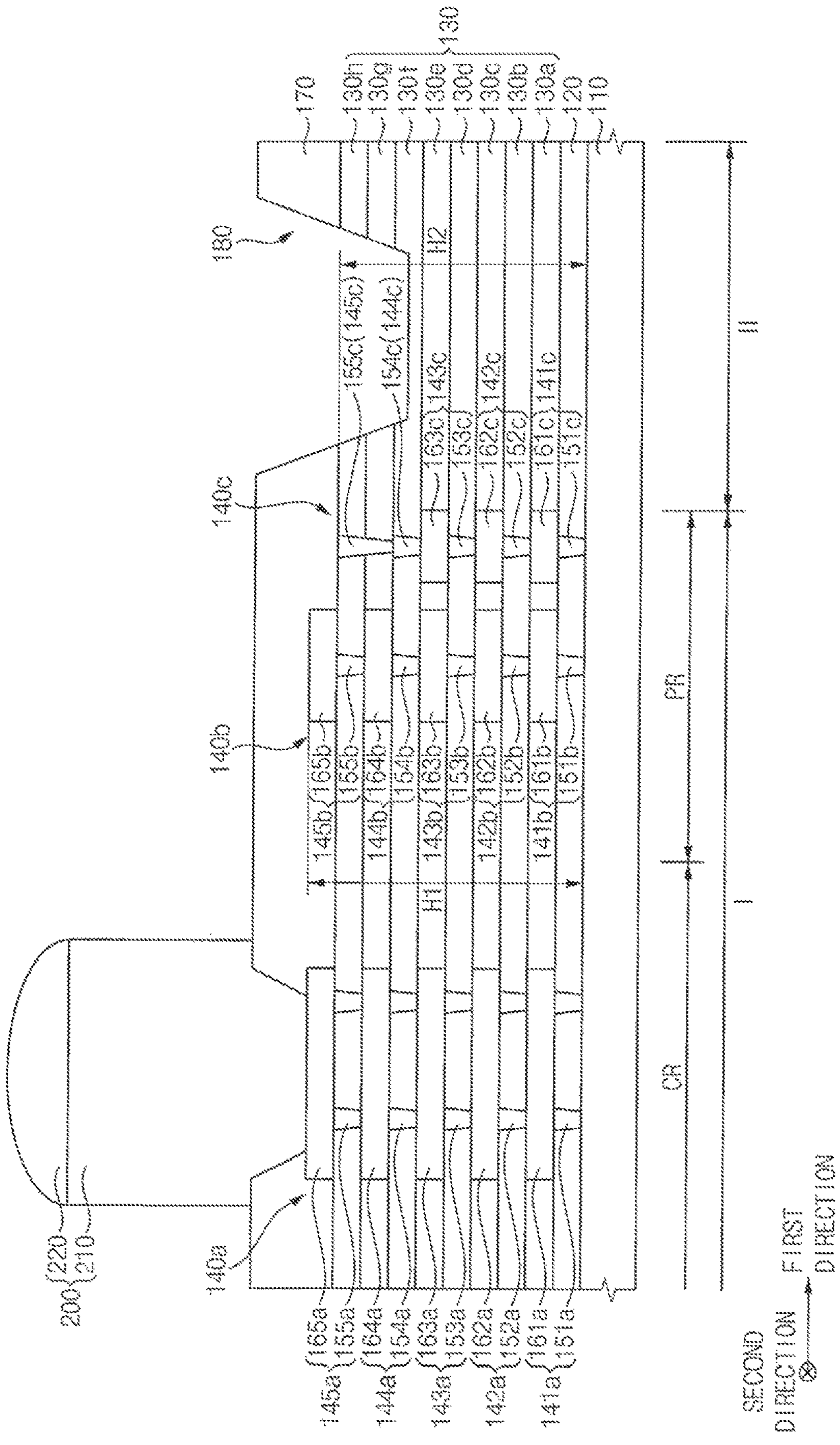
FIGS. 16 and 17 are views illustrating a method of manufacturing a semiconductor package according to an example embodiment.
Figure 17:
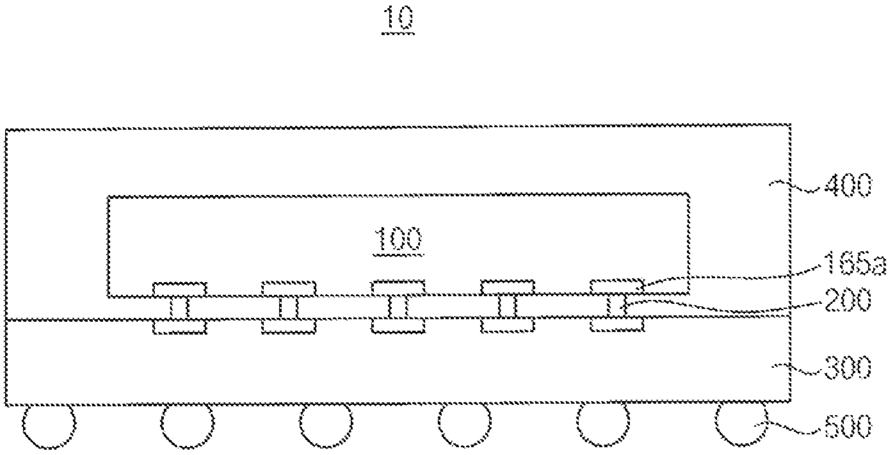

FIGS. 16 and 17 are views illustrating a method of manufacturing a semiconductor package according to an example embodiment. FIG. 16 includes a cross-section cut along the line C-C' in FIG. 6.

Referring to FIG. 16, a conductive bump 200 may be formed on the bonding pad 165*a* of the semiconductor device of FIG. 14.

In example embodiments, the conductive bump 200 may be formed on the bonding pads 165*a* exposed by the passivation layer 170. As shown in FIG. 17, each bonding pad (e.g., bonding pad 165*a*) may include a conductive bump (e.g., conductive bump 200). The conductive bump 200 may include a pillar bump 210 formed on the bonding pad 165*a* and a solder bump 220 formed on the pillar bump 210.

For example, the pillar bump 210 may include copper (Cu), tungsten (W), chromium (Cr), or an alloy thereof. The solder bump 220 may include tin (Sn), lead (Pb), or an alloy thereof. The conductive bump 200 may have a width of 50 μm to 500 μm. Alternatively, the conductive bump may include one solder bump.

Referring to FIG. 17, the wafer W may be cut along the scribe area SA to form an individual semiconductor device 100, and the semiconductor device 100 may be mounted on a package substrate 300 via conductive bumps 200.

In example embodiments, the semiconductor device 100 may be mounted on the package substrate 300 by a flip chip bonding method. In this case, the semiconductor device 100 may be mounted on the package substrate 300 such that an active surface on which the bonding pads are formed, that is, a first surface faces the package substrate 300. An underfill member may be provided between the semiconductor device 100 and the package substrate 300.

Then, a molding member 400 may be formed on the package substrate 300 to cover the semiconductor device 100. For example, the molding member 400 may include an insulating material such as an epoxy molding compound.

Then, external connection members 500 such as solder balls may be disposed on external connection pads on a lower surface of the package substrate 300 to complete a semiconductor package 10.

Figure 18:
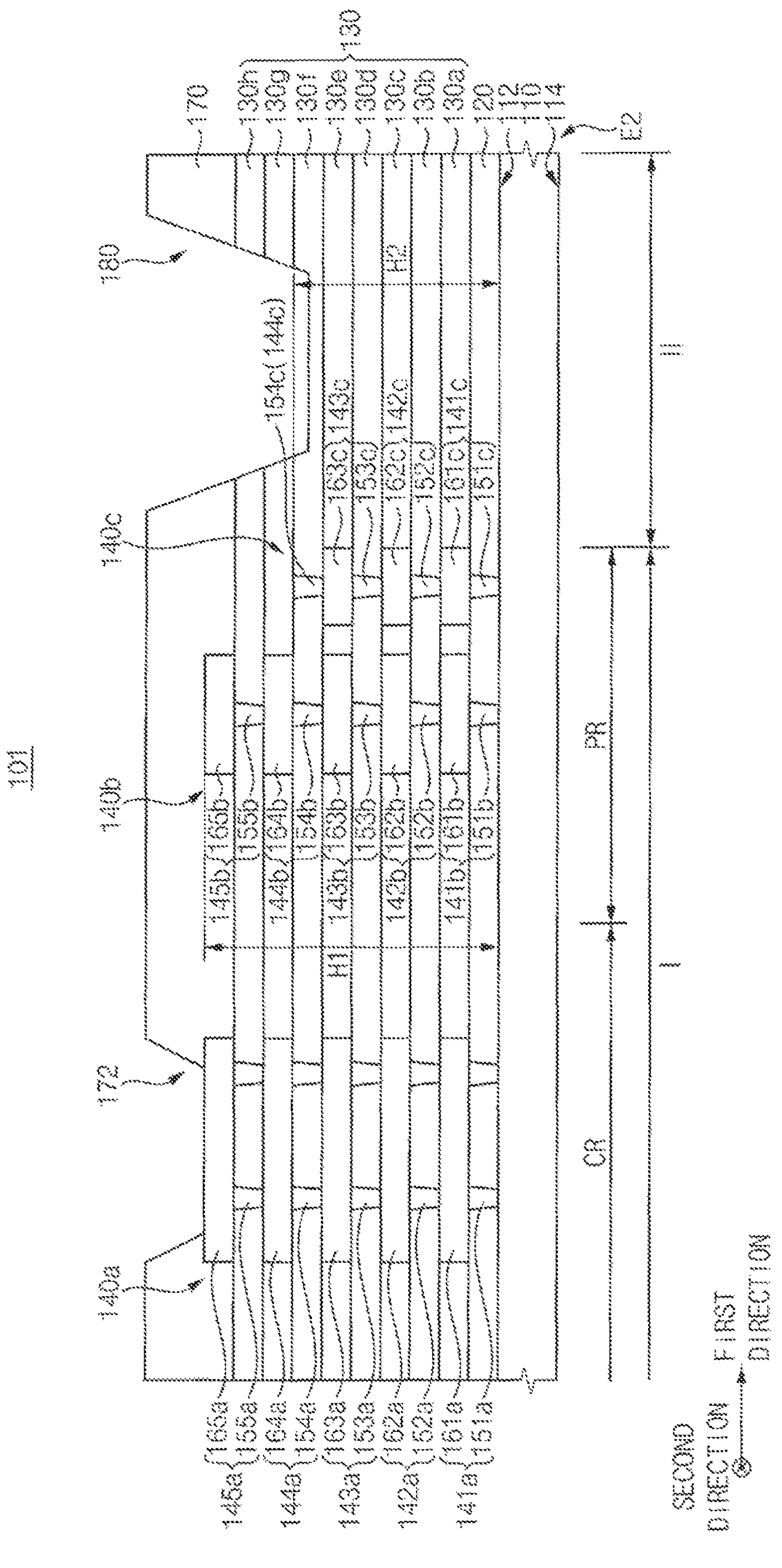
FIG. 18 is a cross-sectional view illustrating a semiconductor device according to an example embodiment.

FIG. 18 is a cross-sectional view illustrating a semiconductor device according to an example embodiment. The semiconductor device may be substantially the same as or similar to the semiconductor device described with reference to FIGS. 1 to 5 except for a configuration of a crack stopper. Thus, same reference numerals will be used to refer to the same or like elements and any further repetitive explanation concerning the above elements will be omitted.

Referring to FIG. 18, a semiconductor device 101 may include a substrate 110, a plurality of insulating layers (e.g., insulating layers 120, 130 and 170), a first protection structure 140*b* as a moisture blocking structure, a second protection structure 140*c* as a crack stopper, and a trench 180.

In example embodiments, the first protection structure 140*b* may include a plurality of wiring layers, including first to fifth wiring layers 141*b*, 142*b*, 143*b*, 144*b* and 145*b* vertically stacked in the insulating layers on a protection region PR of the substrate 110. A fourth wiring layer 144*b*, which is a second uppermost wiring layer of the first protection structure 140*b*, may include a fourth via 154*b* stacked on a third metal wiring 163*b* and a third metal wiring 164*b* stacked on the fourth via 154*b*. A fifth wiring layer 145*b*, which is an uppermost wiring layer of the first protection structure 140*b*, may include a fifth via 155*b* stacked on the fourth metal wiring 164*b* and a fifth metal wiring 165*b* stacked on the fifth via 155*b*.

The second protection structure 140*c* may include a plurality of wiring layers, including first to fourth wiring layers 141*c*, 142*c*, 143*c* and 144*c* vertically stacked in the insulating layers on the protection region PR of the substrate 110. A fourth wiring layer 144*c*, which is a uppermost wiring layer of the second protection structure 140*c*, may include a fourth via 154*c* stacked on a third metal wiring 163*c*.

A height H2 of the uppermost wiring layer 144*c* of the second protection structure 140*c* may be equal to or less than a height of the second uppermost wiring layer 144*b* of the first protection structure 140*b*.

In example embodiments, the first protective structure 140*b* may include a plurality of wiring layers, including wiring layers 141*b*, 142*b*, 143*b*, 144*b* and 145*b* vertically stacked in the insulating layers, and the second protective structure 140*c* may include a plurality of wiring layers, including wiring layers 141*c*, 142*c*, 143*c* and 144*c* vertically stacked in the insulating layers.

Figure 19:
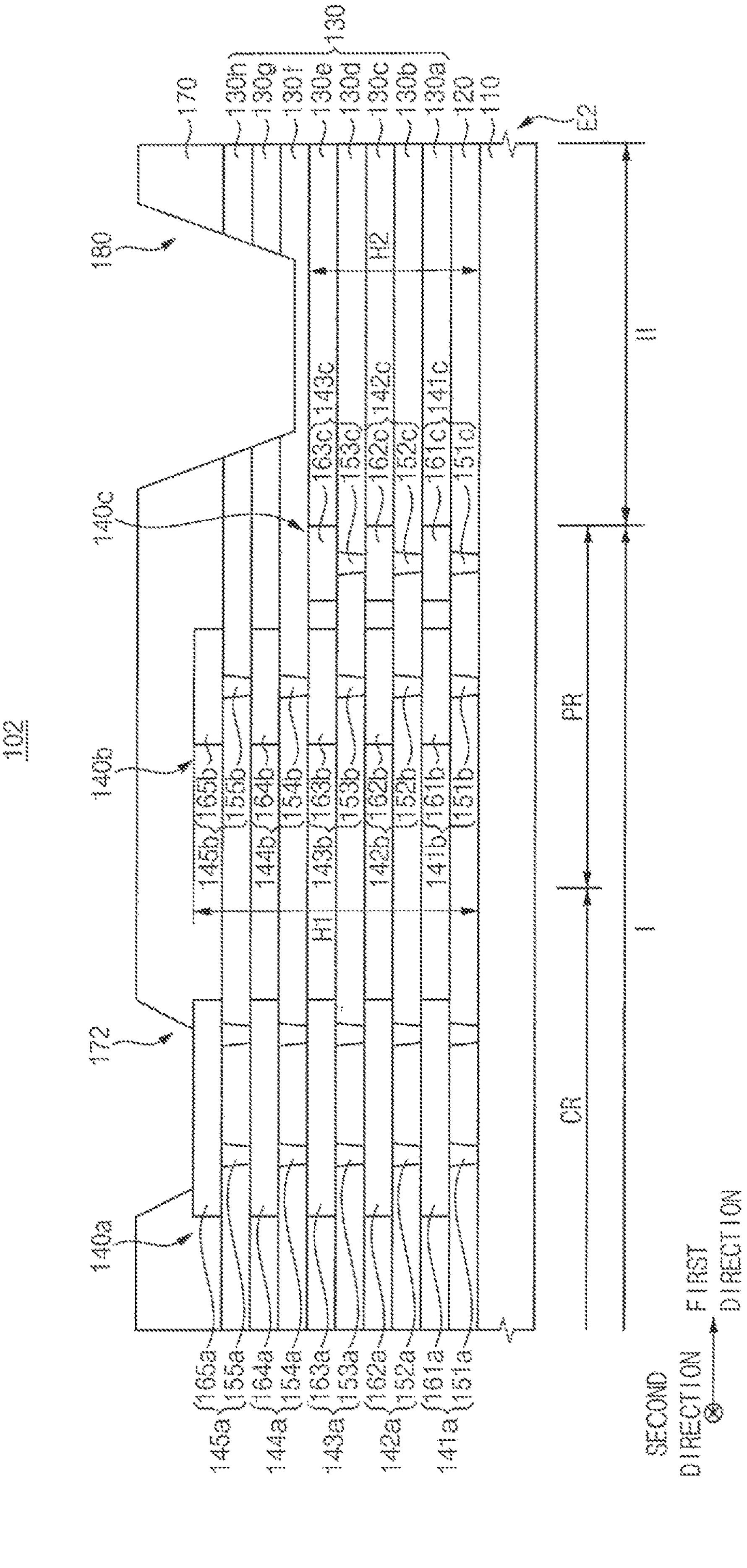
FIG. 19 is a cross-sectional view illustrating a semiconductor device according to an example embodiment.

FIG. 19 is a cross-sectional view illustrating a semiconductor device according to an example embodiment. The semiconductor device may be substantially the same as or similar to the semiconductor device described with reference to FIGS. 1 to 5 except for a configuration of a crack stopper. Thus, same reference numerals will be used to refer to the same or like elements and any further repetitive explanation concerning the above elements will be omitted.

Referring to FIG. 19, a semiconductor device 102 may include a substrate 110, a plurality of insulating layers (e.g., insulating layers 120, 130 and 170), a first protection structure 140*b* as a moisture blocking structure, a second protection structure 140*c* as a crack stopper, and a trench 180.

In example embodiments, the first protection structure 140*b* may include a plurality of wiring layers, including first to fifth wiring layers 141*b*, 142*b*, 143*b*, 144*b* and 145*b* vertically stacked in the insulating layers on a protection region PR of the substrate 110.

The second protection structure 140*c* may include a plurality of wiring layers, including first to third wiring layers 141*c*, 142*c* and 143*c* vertically stacked in the insulating layers on the protection region PR of the substrate 110. A third wiring layer 143*c*, which is an uppermost wiring layer of the second protection structure 140*c*, may include a third via 153*c* stacked on a second metal wiring 162*c* and a third metal wiring 163*c* stacked on the third via 153*c*.

A height H2 of the uppermost wiring layer 143*c* of the second protection structure 140*c* may be equal to a height of a third uppermost wiring layer 143*b* of the first protection structure 140*b*.

In example embodiments, the first protective structure 140*b* may include a plurality of wiring layers, including wiring layers 141*b*, 142*b*, 143*b*, 144*b* and 145*b* vertically stacked in the insulating layers, and the second protective structure 140*c* may include a plurality of wiring layers, including wiring layers 141*c*, 142*c* and 143*c* vertically stacked in the insulating layers.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, high bandwidth memory (HBM) devices, or non-volatile memory devices such as flash memory devices, phase-change RAM (PRAM) devices, magnetoresistive RAM (MRAM) devices, resistive RAM (ReRAM) devices, or the like.

According to one or more example embodiments, there is provided a semiconductor device that may include a moisture blocking structure in a plurality of insulating layers sequentially stacked on a substrate and extending to surround a circuit region, a crack stopper in the insulating layers extending to surround the moisture blocking structure, and a trench extending to surround the crack stopper and having a predetermined thickness from an upper surface of the insulating layers. An uppermost wiring layer of the moisture blocking structure may include a via and a metal wiring stacked on a via, and an uppermost wiring layer of the crack stopper may include a via. Accordingly, since the uppermost wiring layer of the crack stopper may include tungsten instead of aluminum, even though the via of the uppermost wiring layer of the crack stopper is exposed by the trench formed to be relatively larger, it may be possible to prevent a defect in damage due to aluminum in a subsequent bump forming process. Further, since a distance between the trench and the crack stopper can be reduced, sizes of the moisture blocking structure and the crack stopper may be reduced to thereby reduce an area of the protection region.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present disclosure. Accordingly, all such modifications are intended to be included within the scope of example embodiments as defined in the claims.

What is claimed is:

1. A semiconductor device, comprising:

a substrate having a circuit region and a protection region surrounding the circuit region;

a plurality of insulating layers sequentially stacked on the substrate;

a moisture blocking structure extending in the plurality of insulating layers in the protection region of the substrate and surrounding the circuit region, the moisture blocking structure comprising:

a first plurality of wiring layers vertically stacked on a surface of the substrate, wherein an uppermost wiring layer of the first plurality of wiring layers comprises a first via, and a metal wiring provided on the first via;

a crack stopper extending in the plurality of insulating layers in the protection region of the substrate and surrounding the moisture blocking structure, the crack stopper comprising a second plurality of wiring layers vertically stacked on the surface of the substrate, wherein an uppermost wiring layer of the second plurality of wiring layers comprises a second via; and a trench surrounding the crack stopper, the trench having a predetermined depth from an upper surface of the plurality of insulating layers, wherein, in a first direction, the moisture blocking structure is adjacent to the crack stopper which is spaced apart from the moisture blocking structure in the first direction, and wherein, in the first direction, the crack stopper is adjacent to the trench which is spaced apart from the moisture blocking structure with the crack stopper therebetween.

2. The semiconductor device of claim 1, wherein the second via of the uppermost wiring layer of the second plurality of wiring layers of the crack stopper comprises tungsten.

3. The semiconductor device of claim 2, wherein the metal wiring of the uppermost wiring layer of the first plurality of wiring layers of the moisture blocking structure comprises aluminum.

4. The semiconductor device of claim 1, wherein a wiring layer under the uppermost wiring layer of the second plurality of wiring layers comprises a third via, and the second via of the uppermost wiring layer of the second plurality of wiring layers is provided on the third via.

5. The semiconductor device of claim 1, wherein the uppermost wiring layer of the first plurality of wiring layers of the moisture blocking structure has a first height from the surface of the substrate, and the uppermost wiring layer of the second plurality of wiring layers of the crack stopper has a second height from the surface of the substrate, and wherein the second height is less than the first height.

6. The semiconductor device of claim 5, wherein the second height is equal to or less than a third height of a first lower wiring layer under the uppermost wiring layer of the first plurality of wiring layers of the moisture blocking structure.

7. The semiconductor device of claim 6, wherein the second height is the same as a fourth height of a second lower wiring layer under the first lower wiring layer.

8. The semiconductor device of claim 1, wherein the trench has a width of about 3 μm to about 4 μm.

9. The semiconductor device of claim 1, wherein a spacing distance between the crack stopper and the trench is less than about 1 μm.

10. The semiconductor device of claim 1, wherein the second via comprises a linear type via structure extending in one direction within the protection region.

11. A semiconductor device, comprising:

a substrate comprising a circuit region;

a plurality of insulating layers sequentially stacked on the substrate;

a first protection structure comprising a first plurality of wiring layers vertically stacked in the plurality of insulating layers on a surface of the substrate, the first protection structure extending along an edge of the substrate and surrounding the circuit region;

a second protection structure comprising a second plurality of wiring layers vertically stacked in the plurality of insulating layers on the surface of the substrate, the second protection structure surrounding the first protection structure; and a trench surrounding the second protection structure, the trench having a predetermined depth from an upper surface of the plurality of insulating layers, wherein the first plurality of wiring layers of the first protection structure has a first height from the surface of the substrate, the second plurality of wiring layers of the second protection structure has a second height from the surface of the substrate, and the second height is less than the first height.

12. The semiconductor device of claim 11, wherein an uppermost wiring layer of the second plurality of wiring layers of the second protection structure comprises a first via.

13. The semiconductor device of claim 12, wherein the first via of the uppermost wiring layer of the second plurality of wiring layers of the second protection structure comprises tungsten.

14. The semiconductor device of claim 12, wherein an uppermost wiring layer of the first plurality of wiring layers of the first protection structure comprises a second via and a metal wiring provided on the second via.

15. The semiconductor device of claim 14, wherein the metal wiring of the uppermost wiring layer of the first plurality of wiring layers of the first protection structure comprises aluminum.

16. The semiconductor device of claim 12, wherein a wiring layer under the uppermost wiring layer of the second plurality of wiring layers of the second protection structure comprises a third via, and the first via of the uppermost wiring layer of the second plurality of wiring layers is provided on the third via.

17. The semiconductor device of claim 12, wherein the second via of the uppermost wiring layer of the second plurality of wiring layers of the second protection structure comprises a linear type via structure extending in one direction within a protection region different from the circuit region.

18. The semiconductor device of claim 11, wherein the second height of the second plurality of wiring layers of the second protection structure is equal to or less than a third height of a lower wiring layer under an uppermost wiring layer of the first plurality of wiring layers of the first protection structure.

19. The semiconductor device of claim 11, wherein a spacing distance between the second protection structure and the trench is less than about 1 μm.

20. A semiconductor device, comprising:

a substrate having a circuit region;

a plurality of insulating layers sequentially stacked on the substrate;

a first protection structure comprising N wiring layers vertically stacked in the plurality of insulating layers on a surface of the substrate, the first protection structure extending along an edge of the substrate and surrounding the circuit region;

a second protection structure comprising M wiring layers vertically stacked in the plurality of insulating layers on the surface of the substrate, the second protection structure surrounding the first protection structure; and a trench surrounding the second protection structure, the trench having a predetermined depth from an upper surface of the plurality of insulating layers, wherein M and N are natural numbers and M is less than N, wherein an uppermost wiring layer of the N wiring layers of the first protection structure comprises a first via and a metal wiring stacked on the first via, and wherein an uppermost wiring layer of the M wiring layers of the second protection structure comprises a second via.

* * * * *